US007749299B2

(12) United States Patent
Vanheusden et al.

(10) Patent No.: US 7,749,299 B2
(45) Date of Patent: *Jul. 6, 2010

(54) PRODUCTION OF METAL NANOPARTICLES

(75) Inventors: Karel Vanheusden, Placitas, NM (US); Klaus Kunze, Albuquerque, NM (US); Hyungrak Kiim, Albuquerque, NM (US); Aaron D. Stump, Albuquerque, NM (US); Allen B. Schult, Albuquerque, NM (US); Mark J. Hampden-Smith, Albuquerque, NM (US); Chuck Edwards, Rio Rancho, NM (US); Anthony R. James, Rio Rancho, NM (US); James Caruso, Albuquerque, NM (US); Toivo T. Kodas, Albuquerque, NM (US); Scott Thomas Haubrich, Albuquerque, NM (US); Mark H. Kowalski, Albuquerque, NM (US)

(73) Assignee: Cabot Corporation, Boston, MA (US)

( * ) Notice: Subject to any disclaimer, the term of this patent is extended or adjusted under 35 U.S.C. 154(b) by 920 days.

This patent is subject to a terminal disclaimer.

(21) Appl. No.: 11/331,230

(22) Filed: Jan. 13, 2006

(65) Prior Publication Data
US 2007/0034052 A1 Feb. 15, 2007

Related U.S. Application Data

(60) Provisional application No. 60/643,577, filed on Jan. 14, 2005, provisional application No. 60/643,629, filed on Jan. 14, 2005, provisional application No. 60/643,578, filed on Jan. 14, 2005.

(51) Int. Cl.
*B22F 9/24* (2006.01)
(52) U.S. Cl. .............................. 75/362; 75/371; 977/896
(58) Field of Classification Search ...................... None
See application file for complete search history.

(56) References Cited

U.S. PATENT DOCUMENTS

| 2,785,964 | A | 3/1957 | Pollock |
| 3,313,632 | A | 4/1967 | Langley et al. ................ 106/1 |
| 3,401,020 | A | 9/1968 | Kester et al. |
| 3,683,382 | A | 8/1972 | Ballinger ...................... 346/74 |
| 3,814,696 | A | 6/1974 | Verdone et al. ............. 252/317 |
| 3,922,355 | A | 11/1975 | Kotthoff |
| 3,922,388 | A | 11/1975 | Schebalin |
| RE28,972 | E | 9/1976 | Weber et al. |
| 4,019,188 | A | 4/1977 | Hochberg et al. ............. 346/75 |
| 4,105,483 | A | 8/1978 | Lin .............................. 156/154 |
| 4,122,062 | A | 10/1978 | Monte et al. ............. 260/42.14 |
| 4,130,671 | A | 12/1978 | Nagesh et al. ............... 427/125 |
| 4,170,480 | A | 10/1979 | Ikenoue et al. ............. 96/114.1 |
| 4,186,244 | A | 1/1980 | Deffeyes et al. ............. 428/570 |
| 4,211,668 | A | 7/1980 | Tate ............................. 252/316 |
| 4,255,291 | A | 3/1981 | Needes et al. ............... 252/578 |
| 4,266,229 | A | 5/1981 | Mansukhani ................ 346/1.1 |
| 4,289,534 | A | 9/1981 | Deffeyes et al. ............. 106/1.14 |
| 4,333,966 | A | 6/1982 | Deffeyes et al. ............... 427/96 |
| 4,370,308 | A | 1/1983 | Williams et al. |
| 4,381,945 | A | 5/1983 | Nair ........................... 106/1.14 |
| 4,407,674 | A | 10/1983 | Ehrreich ....................... 75/251 |
| 4,416,932 | A | 11/1983 | Nair ........................... 428/209 |
| 4,418,099 | A | 11/1983 | Cuevas et al. ............... 427/229 |
| 4,419,383 | A | 12/1983 | Lee ............................... 427/47 |
| 4,463,030 | A | 7/1984 | Deffeyes et al. ............. 427/216 |
| 4,487,811 | A | 12/1984 | Eichelberger et al. ....... 428/546 |
| 4,508,753 | A | 4/1985 | Stepan ...................... 427/53.1 |
| 4,517,252 | A | 5/1985 | Hugh .......................... 428/553 |
| 4,539,041 | A | 9/1985 | Figlarz et al. ................. 75/0.5 |
| 4,548,879 | A | 10/1985 | St. John et al. ................ 427/96 |
| 4,599,277 | A | 7/1986 | Brownlow et al. .......... 428/552 |
| 4,622,069 | A | 11/1986 | Akai et al. ................. 106/1.11 |
| 4,627,875 | A | 12/1986 | Kobayashi et al. ............ 106/22 |
| 4,650,108 | A | 3/1987 | Gallagher ................... 228/124 |
| 4,668,533 | A | 5/1987 | Miller .......................... 427/98 |
| 4,720,418 | A | 1/1988 | Kuo |
| 4,753,821 | A | 6/1988 | Giesecke et al. .............. 427/98 |
| 4,775,439 | A | 10/1988 | Seeger, Jr. et al. ........... 156/231 |
| 4,808,274 | A | 2/1989 | Nguyen ...................... 204/15 |
| 4,857,241 | A | 8/1989 | Straw et al. ................. 261/152 |
| 4,859,241 | A | 8/1989 | Grundy ...................... 106/114 |
| 4,877,451 | A | 10/1989 | Winnik et al. ................ 106/23 |
| 4,877,647 | A | 10/1989 | Klabunde ................... 427/123 |
| 4,879,104 | A | 11/1989 | List et al. |
| 4,891,242 | A | 1/1990 | Ito et al. ..................... 437/53.1 |
| 4,892,798 | A | 1/1990 | Lamanna et al. ............. 430/38 |
| 4,931,168 | A | 6/1990 | Watanabe et al. ........... 204/284 |
| 4,931,323 | A | 6/1990 | Manitt et al. .............. 427/53.1 |
| 4,948,623 | A | 8/1990 | Beach et al. ................. 427/35 |
| 4,959,430 | A | 9/1990 | Jonas et al. ................. 526/257 |
| 5,011,627 | A | 4/1991 | Lutz et al. |
| 5,028,473 | A | 7/1991 | Vitriol et al. ................ 428/137 |
| 5,039,552 | A | 8/1991 | Riemer ........................ 427/96 |
| 5,045,141 | A | 9/1991 | Salensky et al. ............ 156/240 |
| 5,049,434 | A | 9/1991 | Wasulko ..................... 428/202 |
| 5,057,363 | A | 10/1991 | Nakanishi ................ 428/321.5 |

(Continued)

FOREIGN PATENT DOCUMENTS

EP        0 410 765 A3     7/1990

(Continued)

OTHER PUBLICATIONS

Carutenuto, G. et al., "Synthesis and Characterization of Gold-based Nanoscopic Additives for Polymers", Composites Part B: Engineering, vol. 35 (2004), pp. 385-391.*

(Continued)

*Primary Examiner*—George Wyszomierski

(57) ABSTRACT

A process for the production of metal nanoparticles. The process comprises a rapid mixing of a solution of at least about 0.1 mole of a metal compound that is capable of being reduced to a metal by a polyol with a heated solution of a polyol and a substance that is capable of being adsorbed on the nanoparticles.

148 Claims, No Drawings

U.S. PATENT DOCUMENTS

| | | | |
|---|---|---|---|
| 5,059,242 A | 10/1991 | Firmstone et al. | 106/1.23 |
| 5,075,262 A | 12/1991 | Nguyen et al. | 501/19 |
| 5,091,003 A | 2/1992 | Boaz | 106/20 |
| 5,121,127 A | 6/1992 | Toriyama | 343/700 |
| 5,132,248 A | 7/1992 | Drummond et al. | |
| 5,139,818 A | 8/1992 | Mance | 427/54.1 |
| 5,148,355 A | 9/1992 | Lowe et al. | |
| 5,153,023 A | 10/1992 | Orlowski et al. | 427/555 |
| 5,160,366 A | 11/1992 | Shibata | 75/232 |
| 5,173,330 A | 12/1992 | Asano et al. | 427/558 |
| 5,176,744 A | 1/1993 | Muller | 106/1.26 |
| 5,176,764 A | 1/1993 | Abbott et al. | 152/158 |
| 5,183,784 A | 2/1993 | Nguyen et al. | 501/19 |
| 5,215,820 A | 6/1993 | Hosokawa et al. | 428/403 |
| 5,216,207 A | 6/1993 | Prabhu et al. | 174/256 |
| 5,244,538 A | 9/1993 | Kumar | 156/643 |
| 5,250,229 A | 10/1993 | Hara et al. | 252/518 |
| 5,270,368 A | 12/1993 | Lent et al. | 524/236 |
| 5,281,261 A | 1/1994 | Lin | |
| 5,312,480 A | 5/1994 | Lotze et al. | 106/1.13 |
| 5,312,674 A | 5/1994 | Haertling et al. | 428/210 |
| 5,329,293 A | 7/1994 | Liker | 347/11 |
| 5,332,646 A | 7/1994 | Wrigt et al. | 430/137 |
| 5,366,760 A | 11/1994 | Fujii et al. | 427/96 |
| 5,378,408 A | 1/1995 | Carroll et al. | 252/514 |
| 5,378,508 A | 1/1995 | Castro et al. | 427/556 |
| 5,384,953 A | 1/1995 | Economikos et al. | 29/846 |
| 5,395,452 A | 3/1995 | Kobayashi et al. | 118/715 |
| 5,403,375 A | 4/1995 | Konig et al. | 75/255 |
| 5,421,926 A | 6/1995 | Yukonobu et al. | 156/83 |
| 5,433,893 A | 7/1995 | Jost et al. | 252/514 |
| 5,444,453 A | 8/1995 | Lalezari | 343/700 |
| 5,463,057 A | 10/1995 | Graetzel et al. | 546/4 |
| 5,494,550 A | 2/1996 | Benge | 156/244 |
| 5,501,150 A | 3/1996 | Leenders et al. | 101/466 |
| 5,539,041 A | 7/1996 | Arnold et al. | 524/494 |
| 5,559,057 A | 9/1996 | Goldstein | 437/228 |
| 5,565,143 A | 10/1996 | Chan | 252/514 |
| 5,571,311 A | 11/1996 | Belmont et al. | |
| 5,587,111 A | 12/1996 | Watanabe et al. | 252/514 |
| 5,599,046 A | 2/1997 | Behm et al. | 283/83 |
| 5,601,638 A | 2/1997 | Fukuda et al. | 106/19 |
| 5,604,027 A | 2/1997 | Sheridon | 428/323 |
| 5,604,673 A | 2/1997 | Washburn et al. | 363/147 |
| 5,645,932 A | 7/1997 | Uchibori | 428/347 |
| 5,665,472 A | 9/1997 | Tanaka et al. | 428/402 |
| 5,679,724 A | 10/1997 | Sacripante et al. | 523/161 |
| 5,712,673 A | 1/1998 | Hayashi et al. | 347/217 |
| 5,716,663 A | 2/1998 | Capote et al. | |
| 5,725,647 A | 3/1998 | Carlson et al. | 106/31.86 |
| 5,725,672 A | 3/1998 | Schmitt et al. | 118/715 |
| 5,746,868 A | 5/1998 | Abe | 156/247 |
| 5,747,222 A | 5/1998 | Ryu | 430/312 |
| 5,747,562 A | 5/1998 | Mahmud et al. | |
| 5,750,194 A | 5/1998 | Watanabe et al. | 427/216 |
| 5,751,325 A | 5/1998 | Leenders et al. | 347/96 |
| 5,759,230 A | 6/1998 | Chow et al. | |
| 5,759,712 A | 6/1998 | Hockaday | 429/30 |
| 5,767,810 A | 6/1998 | Hagiwara et al. | 343/700 |
| 5,781,158 A | 7/1998 | Ko et al. | 343/700 |
| 5,801,108 A | 9/1998 | Huang et al. | 501/32 |
| 5,826,329 A | 10/1998 | Roth | 29/846 |
| 5,828,271 A | 10/1998 | Stitzer | 333/24.1 |
| 5,837,041 A | 11/1998 | Bean et al. | 106/31.6 |
| 5,837,045 A | 11/1998 | Johnson et al. | 106/31.85 |
| 5,838,271 A | 11/1998 | Park | 341/144 |
| 5,838,567 A | 11/1998 | Boggio, Jr. | |
| 5,846,615 A | 12/1998 | Sharma et al. | 427/597 |
| 5,853,470 A | 12/1998 | Martin et al. | 106/31.86 |
| 5,879,715 A | 3/1999 | Higgins et al. | 424/489 |
| 5,882,722 A | 3/1999 | Kydd | 427/123 |
| 5,894,038 A | 4/1999 | Sharma et al. | 427/554 |
| 5,909,083 A | 6/1999 | Asano et al. | 313/584 |
| 5,930,026 A | 7/1999 | Jacobson et al. | 359/296 |
| 5,932,280 A | 8/1999 | Roth | 427/102 |
| 5,953,037 A | 9/1999 | Hayashi et al. | 347/172 |
| 5,962,085 A | 10/1999 | Hayashi et al. | 427/585 |
| 5,966,580 A | 10/1999 | Watanabe et al. | 419/9 |
| 5,992,320 A | 11/1999 | Kosaka et al. | 101/401.1 |
| 5,997,044 A | 12/1999 | Behm et al. | 283/83 |
| 5,998,085 A | 12/1999 | Isberg et al. | 430/200 |
| 6,019,926 A | 2/2000 | Southward et al. | 264/216 |
| 6,025,026 A | 2/2000 | Smith et al. | 427/316 |
| 6,027,762 A | 2/2000 | Tomita et al. | 427/96 |
| 6,036,889 A | 3/2000 | Kydd | 252/512 |
| 6,042,643 A | 3/2000 | Belmont et al. | |
| 6,074,725 A | 6/2000 | Kennedy | 428/188 |
| 6,080,261 A | 6/2000 | Popat et al. | 156/240 |
| 6,099,897 A | 8/2000 | Sayo et al. | 427/180 |
| 6,103,393 A | 8/2000 | Kodas et al. | 428/570 |
| 6,103,868 A | 8/2000 | Heath et al. | 528/482 |
| 6,109,175 A | 8/2000 | Kinoshita | 101/170 |
| 6,118,426 A | 9/2000 | Albert et al. | |
| 6,124,851 A | 9/2000 | Jacobson | 345/206 |
| 6,133,147 A | 10/2000 | Rhee et al. | 438/677 |
| 6,143,356 A | 11/2000 | Jablonski | 427/96 |
| 6,153,348 A | 11/2000 | Kydd et al. | 430/119 |
| 6,156,837 A | 12/2000 | Branan, Jr. et al. | |
| 6,169,129 B1 | 1/2001 | Mahmud et al. | |
| 6,169,837 B1 | 1/2001 | Kato et al. | |
| 6,177,151 B1 | 1/2001 | Chrisey et al. | 427/596 |
| 6,190,731 B1 | 2/2001 | Tecle | 427/213.3 |
| 6,197,147 B1 | 3/2001 | Bonsel et al. | 156/269 |
| 6,197,366 B1 | 3/2001 | Takamatsu | 427/125 |
| 6,200,405 B1 | 3/2001 | Nakazawa et al. | 156/248 |
| 6,207,268 B1 | 3/2001 | Kosaka et al. | 428/325 |
| 6,214,259 B1 | 4/2001 | Oda et al. | 252/500 |
| 6,214,520 B1 | 4/2001 | Wolk et al. | 430/273.1 |
| 6,238,734 B1 | 5/2001 | Senzaki et al. | 427/226 |
| 6,245,494 B1 | 6/2001 | Andriessen et al. | 430/346 |
| 6,251,471 B1 | 6/2001 | Granoff et al. | 427/97 |
| 6,251,488 B1 | 6/2001 | Miller et al. | 427/596 |
| 6,270,389 B1 | 8/2001 | Kobayashi et al. | 445/24 |
| 6,274,412 B1 | 8/2001 | Kydd et al. | 438/149 |
| 6,277,740 B1 | 8/2001 | Goldstein | 438/660 |
| 6,294,401 B1 | 9/2001 | Jacobson et al. | 438/99 |
| 6,296,896 B1 | 10/2001 | Takahashi et al. | 427/77 |
| 6,317,023 B1 | 11/2001 | Felten | 338/254 |
| 6,323,096 B1 | 11/2001 | Saia et al. | 438/384 |
| 6,328,894 B1 | 12/2001 | Chan et al. | 210/638 |
| 6,329,899 B1 | 12/2001 | Hunt et al. | 338/308 |
| 6,338,809 B1 | 1/2002 | Hampden-Smith et al. | 264/7 |
| 6,348,295 B1 | 2/2002 | Griffith et al. | 430/198 |
| 6,356,234 B1 | 3/2002 | Harrison et al. | |
| 6,358,567 B2 | 3/2002 | Pham et al. | 427/421 |
| 6,358,611 B1 | 3/2002 | Nagasawa et al. | 428/403 |
| 6,368,378 B2 | 4/2002 | Sasaki | 75/252 |
| 6,372,158 B1 | 4/2002 | Hashimoto et al. | 252/513 |
| 6,379,742 B1 | 4/2002 | Behm et al. | 427/7 |
| 6,379,745 B1 | 4/2002 | Kydd et al. | 427/96 |
| 6,380,778 B2 | 4/2002 | Uehara et al. | 327/175 |
| 6,395,053 B1 | 5/2002 | Fau et al. | 75/362 |
| 6,399,230 B1 | 6/2002 | Tormey et al. | 428/702 |
| 6,416,150 B1 | 7/2002 | Kimura | 347/14 |
| 6,458,327 B1 | 10/2002 | Vossmeyer | 422/68.1 |
| 6,458,431 B2 | 10/2002 | Hill et al. | 427/537 |
| 6,467,897 B1 | 10/2002 | Wu et al. | 347/102 |
| 6,487,774 B1 | 12/2002 | Nakao et al. | 29/890.1 |
| 6,501,663 B1 | 12/2002 | Pan | |
| 6,503,831 B2 | 1/2003 | Speakman | 438/674 |
| 6,537,359 B1 | 3/2003 | Spa | 106/31.92 |
| 6,541,433 B2 | 4/2003 | Schultz et al. | 510/152 |
| 6,548,036 B2 | 4/2003 | Iida et al. | |
| 6,599,631 B2 | 7/2003 | Kambe et al. | 428/447 |

| | | |
|---|---|---|
| 6,645,569 B2 | 11/2003 | Cramer et al. ............... 427/466 |
| 6,649,138 B2 | 11/2003 | Adams et al. ............... 423/403 |
| 6,660,680 B1 | 12/2003 | Hampden-Smith et al. .. 502/180 |
| 6,667,360 B1 | 12/2003 | Ng et al. ...................... 524/492 |
| 6,713,389 B2 | 3/2004 | Speakman ................... 438/674 |
| 6,730,400 B1 | 5/2004 | Komatsu et al. ............ 428/403 |
| 6,743,319 B2 | 6/2004 | Kydd .......................... 156/230 |
| 6,753,108 B1 | 6/2004 | Hampden-Smith et al. .... 429/44 |
| 6,773,614 B2 | 8/2004 | Field .............................. 216/5 |
| 6,774,036 B2 | 8/2004 | Goldstein ................... 438/660 |
| 6,780,765 B2 | 8/2004 | Goldstein ................... 438/660 |
| 6,811,885 B1 | 11/2004 | Andriessen et al. ......... 428/464 |
| 6,827,772 B2 | 12/2004 | Foster |
| 6,830,778 B1 | 12/2004 | Schulz et al. ............... 427/123 |
| 6,855,196 B2 | 2/2005 | Kawamura et al. ......... 106/31.6 |
| 6,880,909 B2 | 4/2005 | King et al. .................... 347/19 |
| 6,881,239 B2 | 4/2005 | Uchida ......................... 75/252 |
| 6,939,576 B2 | 9/2005 | Deshpande et al. ......... 427/223 |
| 6,951,666 B2 | 10/2005 | Kodas et al. .............. 427/376.6 |
| 7,575,621 B2 * | 8/2009 | Vanheusden et al. .......... 75/351 |
| 2001/0004477 A1 | 6/2001 | Fukunaga et al. ............ 427/475 |
| 2001/0017085 A1 | 8/2001 | Kubo |
| 2002/0006723 A1 | 1/2002 | Goldstein ................... 438/660 |
| 2002/0018861 A1 | 2/2002 | Hill et al. ................... 427/532 |
| 2002/0020491 A1 | 2/2002 | Price et al. ............... 156/307.1 |
| 2002/0058143 A1 | 5/2002 | Hunt et al. .................. 428/412 |
| 2002/0079832 A1 | 6/2002 | Van Tongeren et al. ...... 313/504 |
| 2002/0131254 A1 | 9/2002 | Schaper ...................... 361/760 |
| 2002/0148640 A1 | 10/2002 | Holl et al. ................... 174/256 |
| 2002/0150678 A1 | 10/2002 | Cramer et al. ............... 427/212 |
| 2002/0151161 A1 | 10/2002 | Furusawa |
| 2002/0176987 A1 | 11/2002 | Yadav et al. ................ 428/402 |
| 2003/0009726 A1 | 1/2003 | Chang et al. |
| 2003/0020768 A1 | 1/2003 | Renn ............................. 347/2 |
| 2003/0060038 A1 | 3/2003 | Sirringhaus et al. |
| 2003/0063155 A1 | 4/2003 | Nakao et al. ................... 347/44 |
| 2003/0070569 A1 | 4/2003 | Bulthaup et al. ............. 101/127 |
| 2003/0070747 A1 | 4/2003 | Kydd .......................... 156/233 |
| 2003/0073042 A1 | 4/2003 | Cernigliaro et al. ......... 430/321 |
| 2003/0082485 A1 | 5/2003 | Bulthaup et al. ............. 430/312 |
| 2003/0083203 A1 | 5/2003 | Hashimoto |
| 2003/0085057 A1 | 5/2003 | Hashimoto |
| 2003/0096056 A1 | 5/2003 | Kawamura et al. ............. 427/66 |
| 2003/0102099 A1 | 6/2003 | Yadav et al. ................ 162/208 |
| 2003/0108664 A1 | 6/2003 | Kodas et al. |
| 2003/0110978 A1 | 6/2003 | Abe et al. ................. 106/31.13 |
| 2003/0116057 A1 | 6/2003 | Suzuki et al. ............. 106/31.33 |
| 2003/0123259 A1 | 7/2003 | Furuya et al. ................ 362/489 |
| 2003/0124259 A1 | 7/2003 | Kodas et al. .............. 427/376.6 |
| 2003/0145680 A1 | 8/2003 | Ichida ......................... 75/252 |
| 2003/0146019 A1 | 8/2003 | Hirai |
| 2003/0148024 A1 | 8/2003 | Kodas et al. ................. 427/125 |
| 2003/0151030 A1 | 8/2003 | Gurin ......................... 252/502 |
| 2003/0161959 A1 | 8/2003 | Kodas et al. |
| 2003/0168639 A1 | 9/2003 | Cheon et al. ................ 252/500 |
| 2003/0175411 A1 | 9/2003 | Kodas et al. ................... 427/58 |
| 2003/0180451 A1 | 9/2003 | Kodas et al. ................ 427/123 |
| 2003/0183165 A1 | 10/2003 | Kakimoto et al. ............ 118/35 |
| 2003/0185739 A1 | 10/2003 | Mangold et al. |
| 2003/0185889 A1 | 10/2003 | Yan et al. ..................... 424/484 |
| 2003/0201244 A1 | 10/2003 | Ogawa |
| 2003/0207949 A1 | 11/2003 | Klabunde et al. ............... 516/9 |
| 2003/0211246 A1 | 11/2003 | Kydd et al. .................. 427/282 |
| 2003/0213614 A1 | 11/2003 | Furusawa et al. |
| 2003/0215565 A1 | 11/2003 | Chang et al. |
| 2003/0224104 A1 | 12/2003 | Fukunaga |
| 2003/0228748 A1 | 12/2003 | Nelson et al. |
| 2004/0004209 A1 | 1/2004 | Matsuba et al. ........... 252/518.1 |
| 2004/0030019 A1 | 2/2004 | Kim et al. ................... 524/431 |
| 2004/0038808 A1 | 2/2004 | Hampden-Smith |
| 2004/0043691 A1 | 3/2004 | Abe et al. .................... 445/24 |
| 2004/0058457 A1 | 3/2004 | Huang et al. ................ 436/524 |
| 2004/0074336 A1 | 4/2004 | Daimon et al. |
| 2004/0126708 A1 | 7/2004 | Jing et al. |
| 2004/0140549 A1 | 7/2004 | Miyagawa |
| 2004/0142165 A1 | 7/2004 | Fujii |
| 2004/0144958 A1 | 7/2004 | Conaghan et al. ........... 252/500 |
| 2004/0144959 A1 | 7/2004 | Conaghan et al. ........... 252/500 |
| 2004/0145858 A1 | 7/2004 | Sakurada |
| 2004/0151893 A1 | 8/2004 | Kydd et al. .................. 428/323 |
| 2004/0160465 A1 | 8/2004 | Baker-Smith et al. |
| 2004/0173144 A1 | 9/2004 | Edwards et al. |
| 2004/0182533 A1 | 9/2004 | Blum et al. |
| 2004/0191695 A1 | 9/2004 | Ray et al. |
| 2004/0196329 A1 | 10/2004 | Ready |
| 2004/0201648 A1 | 10/2004 | Sekiya |
| 2004/0206941 A1 | 10/2004 | Gurin ......................... 252/500 |
| 2004/0223926 A1 | 11/2004 | Kobayashi |
| 2004/0231594 A1 | 11/2004 | Edwards et al. |
| 2004/0239730 A1 | 12/2004 | Kurosawa |
| 2004/0247842 A1 | 12/2004 | Koyama et al. ........... 428/195.1 |
| 2004/0250750 A1 | 12/2004 | Reda et al. ..................... 117/84 |
| 2004/0261700 A1 | 12/2004 | Edwards |
| 2004/0263564 A1 | 12/2004 | Mackawa |
| 2004/0265549 A1 | 12/2004 | Kydd ........................... 428/201 |
| 2005/0037614 A1 | 2/2005 | Fukuchi |
| 2005/0056118 A1 | 3/2005 | Xia et al. |
| 2005/0078158 A1 | 4/2005 | Magdassi et al. ............ 347/100 |
| 2005/0116203 A1 | 6/2005 | Takahashi et al. ........... 252/500 |
| 2005/0207930 A1 | 9/2005 | Yamaguchi |
| 2005/0238804 A1 | 10/2005 | Garbar |
| 2006/0001726 A1 | 1/2006 | Kodas et al. |
| 2006/0047014 A1 | 3/2006 | Hopper et al. |
| 2006/0083694 A1 | 4/2006 | Kodas et al. |
| 2006/0115536 A1 * | 6/2006 | Yacaman et al. ............ 424/489 |
| 2006/0158497 A1 | 7/2006 | Vanheusden et al. |
| 2006/0159603 A1 | 7/2006 | Vanheusden et al. |
| 2006/0162497 A1 | 7/2006 | Kodas et al. |
| 2006/0163744 A1 | 7/2006 | Vanheusden et al. |
| 2006/0165898 A1 | 7/2006 | Kodas et al. |
| 2006/0165910 A1 | 7/2006 | Kodas et al. |
| 2006/0166057 A1 | 7/2006 | Kodas et al. |
| 2006/0176350 A1 | 8/2006 | Howarth et al. |
| 2006/0235087 A1 * | 10/2006 | Alexandridis et al. ......... 516/78 |

FOREIGN PATENT DOCUMENTS

| | | |
|---|---|---|
| EP | 0 449 309 B9 | 3/1991 |
| EP | 0 537 502 B1 | 9/1992 |
| EP | 0 641 670 B1 | 8/1994 |
| EP | 0 696 515 B1 | 5/1995 |
| EP | 0 824 138 A2 | 7/1997 |
| EP | 0 930 641 A3 | 1/1999 |
| EP | 0 995 718 B1 | 9/1999 |
| EP | 0 977 212 A2 | 2/2000 |
| EP | 0 982 090 A1 | 3/2000 |
| EP | 1 083 578 A1 | 3/2001 |
| EP | 1 107 298 A2 | 6/2001 |
| EP | 1 339 073 A1 | 9/2001 |
| EP | 1 302 895 A3 | 4/2002 |
| EP | 1 335 393 A1 | 4/2002 |
| EP | 1 426 978 A1 | 8/2002 |
| EP | 0 995 718 B1 | 11/2002 |
| EP | 1 493 780 A1 | 4/2003 |
| EP | 1 323 793 A1 | 7/2003 |
| EP | 1 340 568 A1 | 9/2003 |
| EP | 1 342 760 A1 | 9/2003 |
| EP | 1 544 905 A1 | 9/2003 |
| EP | 1 571 186 A1 | 2/2005 |
| EP | 1 515 348 A2 | 3/2005 |
| JP | 62-113164 | 5/1987 |
| JP | 01-303787 | 7/1989 |
| JP | 2002-124016 | 5/1990 |
| JP | 2000-011875 | 1/2000 |
| JP | 2000-182889 | 6/2000 |
| JP | 2001-167633 | 6/2001 |

| | | |
|---|---|---|
| JP | 2004-311725 | 4/2004 |
| JP | 2005-191059 | 7/2005 |
| JP | 2005-219873 | 8/2005 |
| WO | WO 89/05567 | 6/1989 |
| WO | WO 97/48257 | 12/1997 |
| WO | WO 98/08362 | 2/1998 |
| WO | WO 98/37133 A1 | 8/1998 |
| WO | WO 99/16556 A1 | 4/1999 |
| WO | WO 99/16601 A1 | 4/1999 |
| WO | WO 99/17351 A1 | 4/1999 |
| WO | WO 99/61911 | 12/1999 |
| WO | WO 00/10197 A | 2/2000 |
| WO | WO 00/10736 | 3/2000 |
| WO | WO 00/29208 A1 | 5/2000 |
| WO | WO 00/69235 A1 | 11/2000 |
| WO | WO 00/72224 A1 | 11/2000 |
| WO | WO 01/54203 A2 | 7/2001 |
| WO | WO/01/56736 A2 | 8/2001 |
| WO | WO 01/82315 A1 | 11/2001 |
| WO | WO 01/87503 A1 | 11/2001 |
| WO | WO 02/04698 A2 | 1/2002 |
| WO | WO 02/05294 A1 | 1/2002 |
| WO | WO 02/098576 A1 | 12/2002 |
| WO | WO 03/018645 A1 | 3/2003 |
| WO | WO 03/032084 A2 | 4/2003 |
| WO | WO 03/035279 A1 | 5/2003 |
| WO | WO 03/038002 A1 | 5/2003 |
| WO | WO 03/051562 A1 | 6/2003 |
| WO | WO 03/106573 A1 | 12/2003 |
| WO | WO 2004/005413 A1 | 1/2004 |
| WO | WO 2004/027787 A1 | 4/2004 |
| WO | WO 2004/030072 A1 | 4/2004 |
| WO | WO 2004/050260 A3 | 6/2004 |
| WO | WO 2004/050350 A1 | 6/2004 |
| WO | WO 2004/062890 A2 | 7/2004 |
| WO | WO 2004/063295 A1 | 7/2004 |
| WO | WO 2004/068918 A3 | 8/2004 |
| WO | WO 2004/075211 | 9/2004 |
| WO | WO 2004/078641 A1 | 9/2004 |
| WO | WO 2004/104153 A1 | 12/2004 |
| WO | WO 2004/105985 A1 | 12/2004 |
| WO | WO 2005/044451 A1 | 5/2005 |
| WO | WO 2006/061557 A1 | 6/2006 |

OTHER PUBLICATIONS

Pages from Aldrich Catalog found by searching "pyrrolidone" at www.sigmaaldrich.com.*

Blum, A.E., et al., "Measurement of Clay Surface Areas By Polyvinylpyrrolidone (PVP) Sorption and Its Use For Quantifying Illite and Smectite Abundance", Clays and Clay Minerals, vol. 52, No. 5, pp. 589-602 (2004).

Carotenuto, G., et al., "A Qualitative Model for the Growth Mechanism of Silver Clusters in Polymer Solution", The European Physical Journal B, 24, pp. 437-441 (2001).

Fievet, F., et al., "Preparing Monodisperse Metal Powders I Micrometer and Submicrometer Sizes by the Polyol Process", MRS Bulletin, Dec. 1989.

Lee, H.K., et al., "One-step preparation of ultrafine poly(acrylonitrile) fibers containing silver nanoparticles", Materials Letters, 59, pp. 2977-2980 (2005).

Wiley, B., et al., "Shape-Controlled Synthesis of Metal Nanostructures: The Case of Silver", Chemistry, A European Journal, 11, pp. 454-463 (2005).

All-Polymer Thin Film Transistors Fabricated by High-Resolution Ink-Jet Printing, Kawase, T., et al. "IEEE International Electron Devices Meeting", pp. 25.5.1-25.5.4 (2000).

All-Polymer Thin Film Transistor Fabricated by High-Resolution Ink-Jet Printing, Shimoda, T., et al. "IEEE International Solid State Circuits Conference", Session 16 (2004).

Custom Color Liquid Ink Development (LID) Process, Goodman, N.B., "Xerox Disclosure Journal", vol. 21, No. 2, p. 157 (1996).

Ink Jet Color Copier and Universal Printer, Pearson, R.C., et al. "IBM Technical Disclosure Bulletin", vol. 16, No. 1, pp. 144-145 (1973).

Inkjet Printing of Nanosized Silver Colloids, Lee, H-H, et al., "Nanotechnology" 16, pp. 2436-2441 (2005).

Monolayer-Protected Clusters: Molecular Precursors to Metal Films "Chemical Materials", 13, pp. 87-95 (2001).

Oligomeric Ketoester Precursors For Improved Polyimide Planarization and Gapfilling "IBM Technical Disclosure Bulletin", vol. 30, No. 1, pp. 343-346 (1987).

Porosity-Grain Growth Relationships in the Sintering of Nanocrystalline Ceramics "NanoStructured Materials", vol. 3, pp. 43-52 (1993).

Smoothing of Irregular $SiO_2$ Surfaces, Spencer, O.S. "IBM Technical Disclosure Bulletin", vol. 20, No. 11B, pp. 4842-4843 (1978).

Advanced Materials Systems for Ultra-Low-Temperature, Digital, Direct-Write Technologies, Digital, Direct Write Technologies, Vanheusden, et al., "Direct-Write Technologies for Rapid Prototyping Applications", pp. 123-173 (2001).

Dispersion and Stability of Silver Inks, Tay, et al., "Journal of Materials Science" vol. 37, pp. 4653-4661 (2002).

Ethylene Glycol-Mediated Synthesis of Metal Oxide Nanowires, X. Jiang, Y. Wang, T. Herricks, Y. Xia, "Journal of Materials Chemistry" 14, 695-703 (2004).

Fine Line Conductor Manufacturing Using Drop-On-Demand PZT Printing Technology, Szczech, et al. "IEEE Transactions on Electronics Packaging Manufacturing" vol. 25, No. 1 (2002).

Gold and Silve Nanoparticles: A Class of Chromophores with Colors Tunable in the Range from 400 to 750 nm, Y. Sun, Y. Xia, "The Analyst, The Royal Scoiety of Chemistry" 128, 686-691 (2003).

Ink Jet Printing of Hybrid Circuits, R.W. Vest, Tweedell and B.C. Buchanan, "Hybrid Microelectronics" 6, 261, 267 (1983).

Ink-Jet Printed Nanoparticle Microelectromechanical Systems, Fuller, et al., "Journal of Microelectromechanical Systems" vol. 11, No. 1 (2002).

Ink-Jet Printing of Catalyst Patterns for Electroless Metal Deposition, Shah, et al., "American Chemical Society" 15, 1584-1587 (1999).

Large-Scale Synthesis of Monodisperse Nanorods of Se/Te Alloys Through a Homogeneous Nucleation and Solution Growth Process, B. Mayers, B. Gates, Y. Yin, Y. Xia, "Advanced Materials" 13, No. 18 (2001).

Large-Scale Synthesis of Silver Nanocubes: the Role of HICl in Promoting Cube Perfection and Monodispersity, S.H. Im, Y.T. Lee, B. Wiley, Y. Xia "Angewandte Chemical International Edition" 44, 2154-2157 (2005).

Large-Scale Synthesis Of Uniform Silver Nanowires through A Soft, Self-Seeding, Polyol Process "Advanced Materials" 14, No. 11 (2002).

Late-News Paper: Inkjet-Printed Bus and Address Electrodes For Plasma Display, Furusawa, et al., "SID 02 Digest" pp. 753-755.

Liquid Ink Jet Printing With MOD Inks for Hybrid Microcircuits, K.F. Teng, R.W. Vest "IEEE Transaction on Components, Hybrids and Manufacturing Technology" vol. CHMT-12, No. 4, 545-549 (1987).

Materials, Silver Ink for Jet Printing "NASA Tech Briefs" Aug. 1989.

Microwave-polyol Process for Metal Nanophases, S. Komarneni, H. Katsuki, D. Li, A.S. Bhalla "Journal of Physics, Condensed Matter" 16, S1305-S1312 (2004).

New Development of Nonlinear Optical Crystals for the Ultraviolet Region with Molecular Engineering Approach, C. Chen, Y. Wang, Y. Xia, B. Wu, D. Tang, K. Wu, Z. Wenrong, L. Yu, L. Mei "Journal of Applied Physics" 77, (6) 1995).

New Nonlinear Optical Crystals for UV and VUV Harmonic Generation, Y. Xia, C. Chen, D. Tang, B Wu Advanced Materials: 7, No. 1 (1995).

Physical Mechanisms Governing Pattern Fidelity in Microscale Offset Printing, Darhuber, et al. "Journal of Applied Physics", vol. 90, No. 7, pp. 3602-3609 (2001).

Polyol Synthesis of Uniform Silver Nanowires: A Plausible Growth Mechanism and the Supporting Evidence, Y. Sun, B Mayers, T. Herricks, Y. Xia "Nano Letters" vol. 3, No. 7, 955-960 (2003).

Polyol Synthesis of Silver Nanoparticles: Use of Choloride and Oxygen to Promote the Formation of Single-Crystal, Truncated Cubes and Tetrahedrons, B. Wiley, T. Herricks, V. Sun, Y. Xia "Nano Letters" vol. 4, No. 9, 1733-1739 (2004).

Polyol Synthesis of Platinum Nanoparticles: Control of Morphology with Sodium Nitrate, T. Herricks, J. Chen, Y. Xia "Nano Letters" vol. 4, No. 12, 2367-2371 (2004).

Polyol Synthesis of Platinum Nanostructures: Control of Morphology Through the Manipulation of Reduction Kinetics, J. Chen, T. Herricks, Y. Xia "Angewandte Chemical International Edition" 44, 2589-2592 (2005).

Polyol Synthesis of Silver Nanostructures: Control of Product Morphology with Fe(II) or Fe(III) Species, B. Wiley, Y. Sun, Y. Xia "Langmuir The ACS Journal of Surfaces and Colloids" Vo 21, No. 18 (2005).

Preparation and Characterization of Nano-Sized Ag/PVP Composites for Optical Applications, G Carotenuto, G.P. Pepe, L. Nicolais "The European Physical Journal B" 16, 11-17 (2000).

Preparation of Colloidal Silver Dispersions By The Polyol Process Part 1—Synthesis and Characterization, P.Y. Silvert, R. Herrera-Urbina, N. Duvauchelle, V. Vijayakrishan, K. Tekaia-Elhsissen "Journal of Materials Chemistry" 6(4), 573-577 (1996).

Preparation of Colloidal Silver Dispersions By The Polyol Process Part 2—Mechanism of Particle Formation, P.-Y. Silvert, R. Herrera-Urbina, K. Tekaia-Elhsissen "Journal of Materials Chemistry" 7(2),293-299 (1997).

Preparation of Gold, Platinum, Palladium and Silver Nanoparticles by the Reduction of their Salts with a Weak Reductant-Potassium Bitartrate, Y. Tan, X. Dai, Y. Li, D. Zhu "Journal of Materials Chemistry" 13, 1069-1075 (2003).

Preparation of Polychrome Silver Nanoparticles in Different Solvents, R. He, X. Qian, J. Yin, Z. Zhu "Journal of Materials Chemistry" 12, 3783-3786 (2002).

PVP Protective Mechanism of Ultrafine Silve Powder Synthesized by Chemical Reduction Processes, Z. Zhang, B. Zhao, L. Hu "Journal of Solid State Chemistry" 121, 105-110, Article No. 0015 (1996).

Shape-Controlled Synthesis of Gold and Silver Nanoparticles, Y. Sun, Y. Xia "Science Magazine" vol. 298, pp. 2176-2179 (2002).

Shape-Controlled Synthesis of Silver and Gold Nanostructures, B. Wiley, Y. Sun, J. Chen, H. Cang, Z.Y. Li, X. Li, Y. Xia "MRS Bulletin" vol. 30 (2005).

Silver Nanowires Can Be Directly Coated with Amorphous Silica to Generate Well-Controlled Coaxial Nanocables of Silver/Silica, Y. Yin, Y. Lu, Y. Sun, Y. Xia "Nano Letters" vol. 2, No. 4, 427-430 (2002).

Site Selective Copper and Silver Electroless Metallization Facilitated by a Photolithographically Patterned Hydrogen Silsesquioxane Mediated Seed Layer, Harness, et al. "American Chemical Society".

Snythesis of Monodisperse Au, Pt, Pd, Ru and Ir Nanoparticles in Ethylene Glycol, F.Bonet, V. Delmas, S. Grugeon, R. Herrera Urbina, P-Y. Silvert, K. Tekaia-Elhsissen "NanoStructured Materials" vol. 11, No. 8, pp. 1277-1284 (1999).

Synthesis of Monodisperse Submicronic Gold Particles by the Polyol Process, P-Y. Silvert, K. Tekaia-Elhsissen "Solid State Ionics" 82, 53-60 (1995).

Tape Compositions for the Deposition of Electronic Features, T. Kodas, U.S. Appl. No. 10/274,495, filed Oct. 18, 2002.

Transformation of Silver Nanospheres into Nanobelts and Triangular Nanoplates Through a Thermal Process, Y. Sun, B. Mayers, Y. Xia "Nano Letters" vol. 3, No. 5, 675-679 (2003).

Triangular Nanoplates of Silver: Synthesis, Characterization, and Use as Sacrificial Templates for Generating Triangular Nanorings of Gold, Y. Sun, Y. Xia "Advanced Materials" 15, No. 9 (2003).

Uniform Silver Nanowires Synthesis by Reducing AgNO3 with Ethylene Glycol in the Presence of Seeds and Poly(Vinyl Pyrrolidone), Y. Sun, Y. Yin, B.T. Mayers, T. Herricks, Y. Xia "Chemical Materials" 14, 4736-4745 (2002).

ITT Cuts Costs of PC Board Manufacturing, K. Dreyfack, "Electronics" vol. 52, No. 17 (1979).

(2005) "How Printable Computers Will Work", Worldwide Web Reference Source, http://computer.howstuffworks.com/printable-computer.htm/printable Date Retrieved: May 23, 2005.

(2005) "Definitions of inkjet printer on the Web:", Worldwide Web Reference Source, http://www.google.com/search?hl=en&lr=&oi+defmore&q=define:inkjet+printer Date Retrieved: May 23, 2005.

(2005) "Screen Printing Technology, Principles of Screen-printing", Worldwide Web Reference Source, http://www.spauk.co.uk/TechnicalPages/Screen%20TP.pdf Date Retrieved: May 3, 2006.

(Unknown) "Lithography—definition of Lithography in Encyclopedia", Worldwide Web Reference Source, http://encyclopedia.laborlawtalk.com/Lithography Date Retrieved: May 25, 2005.

(2006) "Photolithography: Definition and Much More From Answers.com", Worldwide Web Reference Source, http://www.answers.com/topic/photolithography Date Retrieved: May 25, 2005.

(Dec. 3, 2002) "Printing Drawings and Photographic Images", Worldwide Web Reference Source, http://histclo.hispeed.com/photo/photo-print.html Date Retrieved: May 25, 2005.

(Apr. 5, 2006) "Photolithography", Worldwide Web Reference Source, http://www.ece.gatech.edu/research/labs/vc/theory/photolith.html Date Retrieved: May 25, 2005.

Measurement of Clay Surface Areas by Polyvinylpyrrolidone (PVP) Sorption and Its Use for Quantifying Illite and Smectite Abundance, A.E. Blum, D.D. Eberl, "Clays and Clay Mineals", vol. 52, No. 5, 589-602 (2004).

Metal Nanoparticle Compositions, Vanheusden, et al. U.S. Appl. No. 11/331,211, filed Jan. 13, 2006.

Separation of Metal Nanoparticles, Vanheusden, et al. U.S. Appl. No. 11/331,238, filed Jan. 13, 2006.

Production of Metal Nanoparticles, Vanheusden, et al. U.S. Appl. No. 11/331,230, filed Jan. 13, 2006.

Replacement of Passive Electrical Components, Howarth, et al. U.S. Appl. No. 11/331,186, filed Jan. 13, 2006.

Circuit Modeling and Selective Deposition, Howarth, et al. U.S. Appl. No. 11/331,188, filed Jan. 13, 2006.

Ink-Jet Printing of Compositionally Non-Uniform Features, Vanheusden, et al. U.S. Appl. No. 11/331,237, filed Jan. 13, 2006.

Printable Electronic Features on Non-Uniform Substrate and Processes for Making Same, Vanheusden, et al., U.S. Appl. No. 11/331,190, filed Jan. 13, 2006.

Controlling Ink Migration During the Formation of Printable Electronic Features, Kowalski, et al., U.S. Appl. No. 11/331,185, filed Jan. 13, 2006.

Processes for Planarizing Substrates and Enapsulating Printable Electronic Features, Mark Kowalski, U.S. Appl. No. 11/331,239, filed Jan. 13, 2006.

Optimized Multi-Layer Printing of Electroics and Displays, Edwards, et al. U.S. Appl. No. 11/331,187, filed Jan. 13, 2006.

A System and Process for Manufacturing Application Specific Printable Circuits (ASPC's) and Other Custom Electronic Devices, Chuck Edwards, U.S. Appl. No. 11/331,189, filed Jan. 13, 2006.

A System and Process for Manufacturing Custom Electronics by Combining Traditional Electronics With Printable Electronics, Chuck Edwards, U.S. Appl. No. 11/331,191, filed Jan. 13, 2006.

Security Features, Their Use, and Processes for Making Them, Hampden-Smith, et al. U.S. Appl. No. 11/331,233, filed Jan. 13, 2006.

* cited by examiner

PRODUCTION OF METAL NANOPARTICLES

CROSS-REFERENCE TO RELATED APPLICATIONS

This application claims the benefit of U.S. Provisional Application Ser. Nos. 60/643,577; 60/643,629; and 60/643,378, all filed on Jan. 14, 2005, the entireties of which are all incorporated herein by reference.

STATEMENT REGARDING FEDERALLY-SPONSORED RESEARCH/DEVELOPMENT

This invention was made with Government support under Agreement No. MDS972-93-2-0014 or DAAD19-02-3-0001 awarded by the Army Research Laboratory ("ARL"). The Government has certain rights in the invention.

BACKGROUND OF THE INVENTION

1. Field of the Invention

The present invention relates to a process for the production of metal nanoparticles. In particular, it relates to a process which affords better control of the size, size distribution and/or shape of the particles than the so-called polyol process.

2. Discussion of Background Information

The production of metal particles by the polyol process is known from, e.g., U.S. Pat. No. 4,539,041 to Figlarz et al., the entire disclosure whereof is expressly incorporated by reference herein. In the polyol process, a metal compound is reduced at an elevated temperature by a polyol to afford the corresponding metal in the form of particles (usually in the micron and nanometer size range). A number of metal compounds and in particular, a number of transition metal compounds can be converted to metal particles by this process. In a typical procedure, a solid metal compound is suspended in a polyol and the suspension is heated until the reduction of the metal compound is substantially complete. Thereafter, the formed particles are isolated by separating them from the liquid phase, e.g., by centrifugation.

A modification of this method is described in, e.g., P. -Y. Silvert et al., "Preparation of colloidal silver dispersions by the polyol process" Part 1—Synthesis and characterization, J. Mater. Chem., 1996, 6(4), 573-577; and Part 2—Mechanism of particle formation, J. Mater. Chem., 1997, 7(2), 293-299. According to the Silvert et al. articles, the entire disclosures whereof are expressly incorporated by reference herein, the polyol process is carried out in the presence of a polymer, i.e., polyvinylpyrrolidone (PVP). In particular, the PVP is dissolved in the polyol and helps to control the size and the dispersity of the metal particles. In a typical experiment, about 10 g of PVP was dissolved at room temperature in 75 ml of ethylene glycol and 2.4 mmole (400 mg) of silver nitrate was added to this solution. The resultant suspension was stirred at room temperature until the silver nitrate had dissolved completely, whereafter the system was heated to 120° C. and the reaction was conducted at this temperature for several hours. After cooling and dilution with water, the reaction mixture afforded silver particles having a mean particle size of 21 nm with a standard deviation of 16%.

While the reported results are desirable, the present inventors have found that when the modified polyol process is scaled up and conducted with a significantly larger amount of metal compound such as, e.g., 0.1 mole of metal compound or more, in order to produce metal nanoparticles in commercially significant amounts, the size and shape of the particles becomes non-uniform and the formation of large chunks, needle-like particles and the like is observed in addition to the formation of sphere-like particles. Accordingly, it would be advantageous to have available a process of the type described by Silvert et al. which affords satisfactory results in terms of particle size, shape and/or size distribution even when it is conducted on a significantly larger scale than that reported by Silvert et al. Corresponding nanoparticles would be useful in variety of applications. For example, there exists a need for compositions for the fabrication of electrically conductive features for use in electronics, displays, and other applications. Accordingly, nanoparticles produced by a process that affords commercially significant amounts of substantially non-agglomerated, redispersible metal nanoparticles with a substantially uniform shape and size could, for example, be used for the manufacture of printing inks and in particular, into inks for the printing of electrically conductive features.

SUMMARY OF THE INVENTION

The present invention provides an improved polyol process for the production of metal nanoparticles. This process comprises the rapid mixing of a solution of at least about 0.1 mole of a metal compound that is capable of being reduced to a metal by a polyol with a heated solution of a polyol and a substance that is capable of being adsorbed on the nanoparticles.

The present invention also provides a process for the production of metal nanoparticles which comprises a rapid mixing of a solution of at least about 0.25 mole of a compound of at least one metal selected from gold, silver, rhodium, palladium, platinum, copper, nickel and cobalt with a heated solution that comprises a polyol and a polymer that is capable of substantially preventing an agglomeration of the nanoparticles.

The present invention further provides a process for the production of silver nanoparticles which comprises a rapid mixing of a solution of at least about 0.5 mole of a silver compound with a heated solution which comprises a polyol and a vinyl pyrrolidone polymer.

The present invention further provides a process for the production of silver nanoparticles which comprises a one-shot addition of a solution of at least about 0.75 mole of a silver compound in ethylene glycol and/or propylene glycol to a heated solution of polyvinylpyrrolidone in ethylene glycol and/or propylene glycol. The solution of the silver compound is at a temperature of not higher than about 30° C., the polyvinylpyrrolidone solution is at a temperature of at least about 110° C. The total volume of the solution of the silver compound and the polyvinylpyrrolidone solution is from about 3 to about 4 liters per one mole of the silver compound and the volume ratio of the polyvinylpyrrolidone solution and the solution of the silver compound is from about 4:1 to about 6:1. The molar ratio of vinyl pyrrolidone units in the polyvinylpyrrolidone and the silver compound is from about 5:1 to about 15:1.

The present invention also provides a process for the production of metal nanoparticles which affords at least about 50 g of substantially non-agglomerated metal nanoparticles in a single run.

The present invention further provides a plurality of substantially non-agglomerated metal nanoparticles which are obtainable by the processes of the present invention, as well as a dispersion of these nanoparticles which has a metal content of at least about 50 g/L and comprises the nanoparticles in a substantially non-agglomerated state.

The present invention also provides process for producing an ink for ink-jet printing, which process comprises combining these nanoparticles with a liquid vehicle.

The present invention also provides a composition which is suitable for the fabrication of an electrically conductive feature by using a direct-write tool. This composition comprises (a) the above metal nanoparticles and (b) a vehicle that is capable of forming a dispersion with the metal nanoparticles.

The present invention also provides for the use of a composition for the fabrication of an electrically conductive feature, wherein the composition comprises (a) metal nanoparticles and (b) a vehicle that is capable of forming a dispersion with the metal nanoparticles.

The present invention also provides a composition for the fabrication of a conductive feature by ink-jet printing. This composition comprises (a) at least about 5 weight percent of silver nanoparticles which are obtainable by one of the processes of the present invention and (b) a vehicle which comprises one or more organic solvents. The composition has a surface tension at 20° C. of from about 20 dynes/cm to about 40 dynes/cm and a viscosity at 20° C. of from about 5 cP to about 15 cP.

The present invention also provides a composition for ink-jet printing. The composition comprises metal nanoparticles metal particles which are obtainable by one of the processes of the present invention, and is capable of being deposited in not more than two passes of an ink-jet printing head on a substrate as a line that can be rendered electrically conductive.

The present invention further comprises a composition for providing a substrate with a metal structure. The composition comprises (a) at least about 10 weight percent of silver nanoparticles which are obtainable by one of the processes of the present invention and have polyvinylpyrrolidone thereon and (b) a vehicle which comprises an organic solvent that is capable of dissolving polyvinylpyrrolidone. The composition has a surface tension at 20° C. of not more than about 50 dynes/cm and a viscosity at 20° C. of not higher than about 30 cP.

The present invention also provides a method for the fabrication of a conductive feature on a substrate, which method comprises forming the feature by applying a composition of the present invention to the substrate and subjecting the feature to heat, pressure and/or radiation to render it conductive. The present invention also provides a conductive feature made by this process.

DETAILED DESCRIPTION OF THE PRESENT INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to set forth the present invention in more detail than is necessary for the fundamental understanding of the present invention, the description making apparent to those skilled in the art how the several forms of the present invention may be embodied in practice.

According to the process of the present invention, a solution of at least about 0.1 mole of a metal compound that is capable of being reduced to a metal by a polyol (or other reductant) is rapidly mixed with a heated solution of a polyol and a substance that is capable of being adsorbed on the nanoparticles. It has been found that the control of the size and/or the size distribution and/or the shape of the nanoparticles formed from the metal compound can be significantly improved when substantially the entire metal compound is employed in dissolved form and contacted with the heated polyol within a relatively short period such as, e.g., within seconds. Compared to the standard polyol process with its gradual dissolution/reaction of a solid metal compound in a polyol, the advantages associated with the way of contacting the metal compound with the polyol according to the present invention are particularly pronounced when the amount of metal compound is relatively large, i.e., where the required volume of the liquid phase and/or the relatively high amount of metal compound per volume of the liquid phase makes it difficult, if not impossible, to avoid local concentration gradients in the course of the dissolution of the metal compound and/or to avoid inhomogeneous reaction conditions. Accordingly, the advantages associated with the process of the present invention in terms of, e.g., particle size, particle size distribution, and/or particle shape in comparison with the standard polyol process will usually become particularly pronounced if the amount of employed metal compound is about 0.1 mole or higher, e.g., at least about 0.25 mole, at least about 0.5 mole, at least about 0.75 mole, or at least about 1 mole and/or if the (initial) concentration of metal compound in the reaction mixture is at least about 0.1 mole, e.g., at least about 0.2 mole, at least about 0.3 mole, or at least about 0.4 mole per liter of reaction mixture.

Metal Compound

The metal compounds that may be used in the process of the present invention include all metal compounds that a polyol can reduce to the corresponding metal (oxidation state=0). Non-limiting examples of such metals include main group metals such as, e.g., lead, tin, antimony and indium, and transition metals such as, e.g., gold, silver, copper, nickel, cobalt, palladium, platinum, iridium, osmium, rhodium, ruthenium, rhenium, vanadium, chromium, manganese, niobium, molybdenum, tungsten, tantalum, iron and cadmium. Examples of preferred metals include gold, silver, copper and nickel, in particular, silver, copper and nickel. Silver is a particularly preferred metal for the purposes of the present invention.

Since the metal compound is to be employed in dissolved form it should be soluble to at least some extent in at least one solvent, preferably a polyol and/or a solvent that is substantially miscible with the heated solution. Also, the metal compound will usually be soluble to at least some extent in the polyol(s) of the heated solution so that there is no substantial precipitation or other separation of the metal compound from the liquid phase when the solution of the metal compound is contacted with the heated solution.

Non-limiting examples of suitable metal compounds include metal oxides, metal hydroxides (including hydrated oxides), metal salts of inorganic and organic acids such as, e.g., nitrates, nitrites, sulfates, halides (e.g., fluorides, chlorides, bromides and iodides), carbonates, phosphates, azides, borates (including fluoroborates, pyrazolylborates, etc.), sulfonates, carboxylates (such as, e.g., formates, acetates, propionates, oxalates and citrates), substituted carboxylates (including halogenocarboxylates such as, e.g., trifluoroacetates, hydroxycarboxylates, aminocarboxylates, etc.) and salts and acids wherein the metal is part of an anion (such as, e.g., hexachloroplatinates, tetrachloroaurate, tungstates and the corresponding acids).

Further non-limiting examples of suitable metal compounds for the process of the present invention include alkoxides, complex compounds (e.g., complex salts) of metals such as, e.g., beta-diketonates (e.g., acetylacetonates), complexes with amines, N-heterocyclic compounds (e.g., pyrrole, aziridine, indole, piperidine, morpholine, pyridine, imidazole, piperazine, triazoles, and substituted derivatives thereof), aminoalcohols (e.g., ethanolamine, etc.), amino acids (e.g., glycine, etc.), amides (e.g., formamides, acetamides, etc.), and nitriles (e.g., acetonitrile, etc.). Non-limiting examples of preferred metal compounds include nitrates, formates, acetates, trifluoroacetates, propionates, oxalates and citrates, particularly nitrates and acetates. Especially for applications of the metal nanoparticles wherein a high electrical conductivity is a desired property, the metal compound is preferably such that the reduction by-product is volatile and/or can be decomposed into a volatile by-product at a relatively low temperature. By way of non-limiting example, the reduction of a metal nitrate will usually result in the formation of nitrogen oxide gases as the only by-products.

Non-limiting examples of specific metal compounds for use in the process of the present invention include silver nitrate, silver nitrite, silver oxide, silver fluoride, silver hydrogen fluoride, silver carbonate, silver oxalate, silver azide, silver tetrafluoroborate, silver acetate, silver propionate, silver butanoate, silver ethylbutanoate, silver pivalate, silver cyclohexanebutanoate, silver ethylhexanoate, silver neodecanoate, silver decanoate, silver trifluoroacetate, silver pentafluoropropionate, silver heptafluorobutyrate, silver trichloroacetate, silver 6,6,7,7,8,8,8-heptafluoro-2,2-dimethyl-3,5-octanedionate, silver lactate, silver citrate, silver glycolate, silver glyconate, silver benzoate, silver salicylate, silver phenylacetate, silver nitrophenylacetate, silver dinitrophenylacetate, silver difluorophenylacetate, silver 2-fluoro-5-nitrobenzoate, silver acetylacetonate, silver hexafluoroacetylacetonate, silver trifluoroacetylacetonate, silver tosylate, silver triflate, silver trispyrazolylborate, silver tris(dimethylpyrazolyl)borate, silver ammine complexes, trialkylphosphine and triarylphosphine derivatives of silver carboxylates, silver beta-diketonates, silver beta-diketonate olefin complexes and silver cyclopentadienides; nickel oxide, nickel hydroxide, nickel chloride, nickel nitrate, nickel sulfate, nickel ammine complexes, nickel tetrafluoroborate, nickel oxalate, nickel isopropoxide, nickel methoxyethoxide, nickel acetylacetonate, nickel formate, nickel acetate, nickel octanoate, nickel ethylhexanoate, and nickel trifluoroacetate; platinum formate, platinum acetate, platinum propionate, platinum carbonate, platinum nitrate, platinum perchlorate, platinum benzoate, platinum neodecanoate, platinum oxalate, ammonium hexafluoroplatinate, ammonium tetrachloroplatinate, sodium hexafluoroplatinate, potassium hexafluoroplatinate, sodium tetrachloroplatinate, potassium hexabromoplatinate, hexachloroplatinic acid, hexabromoplatinic acid, dihydrogen hexahydroxoplatinate, diammine platinum chloride, tetraammine platinum chloride, tetraammine platinum hydroxide, tetraammine platinum tetrachloroplatinate, platinum(II) 2,4-pentanedionate, diplatinum trisdibenzylideneacetonate, platinum sulfate and platinum divinyltetramethyldisiloxane; gold(III) acetate, gold(III) chloride, tetrachloroauric acid, gold azide, gold isocyanide, gold acetoacetate, imidazole gold ethylhexanoate and gold hydroxide acetate isobutyrate; palladium acetate, palladium propionate, palladium ethylhexanoate, palladium neodecanoate, palladium trifluoracetate, palladium oxalate, palladium nitrate, palladium chloride, tetraammine palladium hydroxide, tetraammine palladium nitrate and tetraammine palladium tetrachloropalladate; copper oxide, copper hydroxide, copper nitrate, copper sulfate, copper chloride, copper formate, copper acetate, copper neodecanoate, copper ethylhexanoate, copper methacrylate, copper trifluoroacetate, copper acetoacetate and copper hexafluoroacetylacetonate; cobalt oxide, cobalt hydroxide, cobalt chloride and cobalt sulfate; ruthenium(III) chloride, ruthenium(III) acetylacetonate, ruthenium(III) acetate, ruthenium carbonyl complexes, ruthenium perchlorate, and ruthenium amine complexes; rhodium(III) chloride, rhenium(II) chloride, tin(II) oxide, iron(II) acetate, sodium tungstate and tungstic acid. The above compounds may be employed as such or optionally in the form of solvates and the like such as, e.g., as hydrates.

Examples of preferred metal compounds for use in the present invention include silver nitrate, silver acetate, silver trifluoroacetate, silver oxide, copper oxide, copper hydroxide, copper sulfate, nickel oxide, nickel hydroxide, nickel chloride, nickel sulfate, nickel acetate, cobalt oxide, cobalt hydroxide, cobalt chloride and cobalt sulfate.

The use of mixtures of different compounds, e.g., different salts, of the same metal and/or the use of mixtures of compounds of different metals and/or of mixed metal compounds (e.g., mixed salts and/or mixed oxides) are also contemplated by the present invention. Accordingly, the term "metal compound" as used herein includes both a single metal compound and any mixture of two or more metal compounds. Depending, inter alia, on the metal compounds and reaction conditions employed, the use of more than one metal in the process of the present invention will result in a mixture of nanoparticles of different metals and/or in nanoparticles which comprise different metals in the same nanoparticle, for example, in the form of an alloy or a mixture of these metals. Non-limiting examples of alloys include Ag/Ni, Ag/Cu, Pt/Cu, Ru/Pt, Ir/Pt and Ag/Co.

Polyol

The polyol for use in the present invention may be a single polyol or a mixture of two or more polyols (e.g., three, four or five polyols). In the following description, whenever the term "polyol" is used, this term is meant to include both a single polyol and a mixture of two or more polyols. The polyol may have any number of hydroxyl groups (but at least two) and carbon atoms. Also, the polyol may comprise heteroatoms (such as, e.g., O and N), not only in the form of hydroxyl groups, but also in the form of, e.g., ether, ester, amine and amide groups and the like (for example, it may be a polyester polyol, a polyether polyol, etc.). Preferably, the polyol comprises from about 2 to about 6 hydroxy groups (e.g., 2, 3 or 4 hydroxy groups). Also, the preferred polyol comprises from 2 to about 12 carbon atoms, e.g., up to about 3, 4, 5 or 6 carbon atoms. A particularly preferred group of polyols for use in the present invention are the (alkylene) glycols, i.e., compounds which comprise two hydroxyl groups bound to adjacent (aliphatic or cycloaliphatic) carbon atoms. Usually these glycols will comprise up to about 6 carbon atoms, e.g., 2, 3 or 4 carbon atoms. Ethylene glycol, propylene glycol and the butylene glycols are non-limiting examples of preferred glycols for use in the present invention.

The polyglycols constitute another group of preferred polyols for use in the present invention. Specific and preferred examples thereof are compounds which comprise up to about 6 alkylene glycol units, e.g., up to 4 alkylene glycol units, such as, e.g., diethylene glycol, triethylene glycol, tetraethylene glycol, dipropylene glycol and tripropylene glycol.

Non-limiting examples of other specific compounds which may advantageously be used as the or a polyol in the process of the present invention include 1,3-propanediol, 1,3-butanediol, 1,4-butanediol, glycerol, trimethylolpropane, pentaerythritol, triethanolamine and trihydroxymethylaminomethane.

Of course, it also is possible to use other polyols than those mentioned above, either alone or in combination. For example, sugars and sugar alcohols can form at least a part of the polyol reactant of the process of the present invention. While polyols that are solid or semi-solid at room temperature may be employed, it is preferred that the employed polyol or at least the employed mixture of polyols is liquid at room temperature, although this is not mandatory. Further, it is also possible to use one or more other reducing agents in conjunction with the polyol(s), for example, in order to reduce the required reaction time and/or the reaction temperature. For instance, the substance that is capable of being adsorbed on the nanoparticles may exhibit a reducing effect with respect to the metal compound. A non-limiting example of such a substance is polyvinylpyrrolidone. Non-limiting examples of other reducing agents which may be employed in accordance with the present invention include hydrazine and derivatives thereof; hydroxylamine and derivatives thereof; aldehydes such as, e.g., formaldehyde, hypophosphites, sulfites, tetrahydroborates (such as, e.g., the tetrahydroborates of Li, Na, K), $LiAlH_4$, polyhydroxybenzenes such as, e.g., hydroquinone, alkyl-substituted hydroquinones, catechols and pyrogallol; phenylenediamines and derivatives thereof; aminophenols and derivatives thereof; ascorbic acid and ascorbic acid ketals and other derivatives of ascorbic acid; 3-pyrazolidone and derivatives thereof; hydroxytetronic acid, hydroxytetronamide and derivatives thereof; bisnaphthols and derivatives thereof; sulfonamidophenols and derivatives thereof; and Li, Na and K.

Adsorptive Substance

One of the functions of the substance that is capable of being adsorbed on the nanoparticles (hereafter frequently referred to as "the adsorptive substance") will usually and preferably be to help prevent a substantial agglomeration of the nanoparticles. Due to their small size and the high surface energy associated therewith, the metal nanoparticles exhibit a strong tendency to agglomerate and form larger secondary particles (for example, soft agglomerates). The adsorptive substance will shield (e.g., sterically and/or through charge effects) the nanoparticles from each other to at least some extent and thereby substantially reduce or prevent a direct contact between the individual nanoparticles. The term "adsorbed" as used herein and in the appended claims includes any kind of interaction between the adsorptive substance and a nanoparticle surface (e.g., the metal atoms on the surface of a nanoparticle) that manifests itself in an at least weak bond between the adsorptive substance and the surface of a nanoparticle. Preferably, the bond is strong enough for the nanoparticle-adsorptive substance combination to withstand a washing operation with a solvent for the adsorptive substance. In other words, merely washing the nanoparticles with the solvent at room temperature will preferably not remove more than minor amounts (e.g., less than about 10%, less than about 5%, or less than about 1%) of that part of the adsorptive substance that is in direct contact with (and (weakly) bonded to) the nanoparticle surface. Of course, adsorptive substance that is not in direct contact with a nanoparticle surface and is merely associated with the bulk of the nanoparticles as a contaminant, i.e., without any significant interaction with the nanoparticles, is preferably removable from the nanoparticles by washing the latter with a solvent for the adsorptive substance. Further, it is also preferred for the bond between the adsorptive substance and nanoparticle to be not too strong and, in particular, to not be a covalent bond.

While the adsorptive substance will usually be a single substance or at least comprise substances of the same type, the present invention also contemplates the use of two or more different types of adsorptive substances. For example, a mixture of two or more different low molecular weight compounds or a mixture of two or more different polymers may be used, as well as a mixture of one or more low molecular weight compounds and one or more polymers. The terms "substance that is capable of being adsorbed on the nanoparticles" and "adsorptive substance" as used herein include all of these possibilities. One of skill in the art will understand that volatile components of the mixture such as, e.g., the polyol and/or solvent may also have a tendency of being adsorbed on the nanoparticle surface. These substances do not qualify as "adsorptive substances" within the meaning of this term as used herein.

The adsorptive substance should preferably be compatible with the polyol in the heated solution, i.e., it preferably does not react with the polyol to any significant extent, even at the elevated temperatures that will often be employed in the process of the present invention. If the heated solution does not comprise any other solvent for the adsorptive substance, the substance should also dissolve in the polyol to at least some extent. The adsorptive substance will usually have a solubility at room temperature of at least about 1 g per liter of solvent (including solvent mixtures), e.g., at least about 5 g, at least about 10 g, or at least about 20 g per liter of solvent. Preferably, the adsorptive substance has a solubility of at least about 100 g, e.g., at least about 200 g, or at least about 300 g per liter of solvent.

A preferred and non-limiting example of an adsorptive substance for use in the process of the present invention includes a substance that is capable of electronically interacting with a metal atom of a nanoparticle. Usually, a substance that is capable of this type of interaction will comprise one or more atoms (e.g., at least two atoms) with one or more free electron pairs such as, e.g., oxygen, nitrogen and sulfur. By way of non-limiting example, the adsorptive substance may be capable of a dative interaction with a metal atom on the surface of a nanoparticle and/or of chelating the metal atom. Particularly preferred adsorptive substances comprise one or two O and/or N atoms. The atoms with a free electron pair will usually be present in the substance in the form of a functional group such as, e.g., a hydroxy group, a carbonyl group, an ether group and an amino group, or as a constituent of a functional group that comprises one or more of these groups as a structural element thereof. Non-limiting examples of suitable functional groups include —COO—, —O—CO—O—, —CO—O—CO—, —C—O—C—, —CONR—, —NR—CO—O—, —NR$^1$—CO—NR$^2$—, —CO—NR—CO—, —SO$_2$—NR— and —SO$_2$—O—, wherein R, R$^1$ and R$^2$ each independently represent hydrogen or an organic radical (e.g., an aliphatic or aromatic, unsubstituted or substituted radical comprising from about 1 to about 20 carbon atoms). Such functional groups may comprise the above (and other) structural elements as part of a cyclic structure (e.g., in the form of a cyclic ester, amide, anhydride, imide, carbonate, urethane, urea, and the like).

In one aspect of the process of the present invention, the adsorptive substance is or comprises a substance that is capable of reducing the metal compound, i.e., in addition to the reduction by the polyol used. A specific, non-limiting example of such a substance is polyvinylpyrrolidone (PVP).

The adsorptive substance may comprise a low molecular weight compound, preferably a low molecular weight organic compound, e.g., a compound having a molecular weight of not higher than about 500, more preferably not higher than about 300, and/or may comprise an oligomeric or polymeric compound having a (weight average) molecular weight (in Daltons) of at least about 1,000, for example, at least about 3,000, at least about 5,000, or at least about 8,000, but preferably not higher than about 500,000, e.g., not higher than about 200,000, or not higher than about 100,000. Too high a molecular weight may give rise to an undesirably high viscosity of the solution at a desirable concentration of the adsorptive substance and/or cause flocculation. Also, the most desirable molecular weight may be dependent on the metal. By way of non-limiting example, in the case of polyvinylpyrrolidone, a particularly preferred weight average molecular weight is in the range of from about 3,000 to about 60,000, in particular if the metal comprises silver.

In general, it is preferred for the adsorptive substance to have a total of at least about 10 atoms per molecule which are selected from C, N and O, e.g., at least about 20 such atoms or at least about 50 such atoms. More preferably, the adsorptive substance has a total of at least about 100 C, N and O atoms per molecule, e.g., at least about 200, at least about 300, or at least about 400 C, N and O atoms per molecule. In the case of polymers these numbers refer to the average per polymer molecule.

Non-limiting examples of the low molecular weight adsorptive substance for use in the present invention include fatty acids, in particular, fatty acids having at least about 8 carbon atoms. Non-limiting examples of oligomers/polymers for use as the adsorptive substance in the process of the present invention include homo- and copolymers (including polymers such as, e.g., random copolymers, block copolymers and graft copolymers) which comprise units of at least one monomer which comprises one or more O atoms and/or one or more N atoms. A non-limiting class of preferred polymers for use in the present invention is constituted by polymers which comprise at least one monomer unit which includes at least two atoms which are selected from O and N atoms. Corresponding monomer units may, for example, comprise at least one hydroxyl group, carbonyl group, ether linkage and/or amino group and/or one or more structural elements of formula —COO—, —O—CO—O—, —CO—O—CO—, —C—O—C—, —CONR—, —NR—CO—O—, —NR$^1$—CO—NR$^2$—, —CO—NR—CO—, —SO$_2$—NR— and —SO$_2$—O—, wherein R, R$^1$ and R$^2$ each independently represent hydrogen or an organic radical (e.g., an aliphatic or aromatic, unsubstituted or substituted radical comprising from about 1 to about 20 carbon atoms).

Non-limiting examples of corresponding polymers include polymers which comprise one or more units derived from the following groups of monomers:

(a) monoethylenically unsaturated carboxylic acids of from about 3 to about 8 carbon atoms and salts thereof. This group of monomers includes, for example, acrylic acid, methacrylic acid, dimethylacrylic acid, ethacrylic acid, maleic acid, citraconic acid, methylenemalonic acid, allylacetic acid, vinylacetic acid, crotonic acid, fumaric acid, mesaconic acid and itaconic acid. The monomers of group (a) can be used either in the form of the free carboxylic acids or in partially or completely neutralized form. For the neutralization alkali metal bases, alkaline earth metal bases, ammonia or amines, e.g., sodium hydroxide, potassium hydroxide, sodium carbonate, potassium carbonate, sodium bicarbonate, magnesium oxide, calcium hydroxide, calcium oxide, ammonia, triethylamine, methanolamine, diethanolamine, triethanolamine, morpholine, diethylenetriamine or tetraethylenepentamine may, for example, be used;

(b) the esters, amides, anhydrides and nitriles of the carboxylic acids stated under (a) such as, e.g., methyl acrylate, ethyl acrylate, methyl methacrylate, ethyl methacrylate, n-butyl acrylate, hydroxyethyl acrylate, 2- or 3-hydroxypropyl acrylate, 2- or 4-hydroxybutyl acrylate, hydroxyethyl methacrylate, 2- or 3-hydroxypropyl methacrylate, hydroxyisobutyl acrylate, hydroxyisobutyl methacrylate, monomethyl maleate, dimethyl maleate, monoethyl maleate, diethyl maleate, maleic anhydride, 2-ethylhexyl acrylate, 2-ethylhexyl methacrylate, acrylamide, methacrylamide; N,N-dimethylacrylamide, N-tert-butylacrylamide, acrylonitrile, methacrylonitrile, 2-dimethylaminoethyl acrylate, 2-dimethylaminoethyl methacrylate, 2-diethylaminoethyl acrylate, 2-diethylaminoethyl methacrylate and the salts of the last-mentioned monomers with carboxylic acids or mineral acids and the quaternized products;

(c) acrylamidoglycolic acid, vinylsulfonic acid, allylsulfonic acid, methallylsulfonic acid, styrenesulfonic acid, 3-sulfopropyl acrylate, 3-sulfopropyl methacrylate and acrylamidomethylpropanesulfonic acid and monomers containing phosphonic acid groups, such as, e.g., vinyl phosphate, allyl phosphate and acrylamidomethylpropanephosphonic acid; and esters, amides and anhydrides of these acids;

(d) N-vinyllactams such as, e.g., N-vinylpyrrolidone, N-vinyl-2-piperidone and N-vinylcaprolactam;

(e) vinyl acetal, vinyl butyral, vinyl alcohol and ethers and esters thereof (such as, e.g., vinyl acetate, vinyl propionate and methylvinylether), allyl alcohol and ethers and esters thereof, N-vinylimidazole, N-vinyl-2-methylimidazoline, and the hydroxystyrenes.

Corresponding polymers may also contain additional monomer units, for example, units derived from monomers without functional group, halogenated monomers, aromatic monomers etc. Non-limiting examples of such monomers include olefins such as, e.g., ethylene, propylene, the butenes, pentenes, hexenes, octenes, decenes and dodecenes, styrene, vinyl chloride, vinylidene chloride, tetrafluoroethylene, etc. Further, the polymers for use as adsorptive substance in the process of the present invention are not limited to addition polymers, but also comprise other types of polymers, for example, condensation polymers such as, e.g., polyesters, polyamides, polyurethanes and polyethers, as well as polysaccharides such as, e.g., starch, cellulose and derivatives thereof, etc.

Other non-limiting examples of polymers which are suitable for use as adsorptive substance in the present invention are disclosed in e.g., U.S. Patent Application Publication 2004/0182533 A1, the entire disclosure whereof is expressly incorporated by reference herein.

Preferred polymers for use as adsorptive substance in the present invention include those which comprise units derived from one or more N-vinylcarboxamides of formula (I)

$$CH_2=CH-NR^3-CO-R^4 \qquad (I)$$

wherein R$^3$ and R$^4$ independently represent hydrogen, optionally substituted alkyl (including cycloalkyl) and optionally substituted aryl (including alkaryl and aralkyl) or heteroaryl (e.g., C$_{6-20}$ aryl such as phenyl, benzyl, tolyl and phenethyl, and C$_{4-20}$ heteroaryl such as pyrrolyl, furyl, thienyl and pyridinyl).

R$^3$ and R$^4$ may, e.g., independently represent hydrogen or C$_{1-12}$ alkyl, particularly C$_{1-6}$ alkyl such as methyl and ethyl.

$R^3$ and $R^4$ together may also form a straight or branched chain containing from about 2 to about 8, preferably from about 3 to about 6, particularly preferably from about 3 to about 5 carbon atoms, which chain links the N atom and the C atom to which $R^3$ and $R^4$ are bound to form a ring which preferably has about 4 to about 8 ring members. Optionally, one or more carbon atoms may be replaced by heteroatoms such as, e.g., oxygen, nitrogen or sulfur. Also optionally, the ring may contain a carbon-carbon double bond.

Non-limiting specific examples of $R^3$ and $R^4$ are methyl, ethyl, isopropyl, n-propyl, n-butyl, isobutyl, sec-butyl, tert-butyl, n-hexyl, n-heptyl, 2-ethylhexyl, n-octyl, n-decyl, n-undecyl, n-dodecyl, n-tetradecyl, n-hexadecyl, n-octadecyl and n-eicosyl. Non-limiting specific examples of $R^3$ and $R^4$ which together form a chain are 1,2-ethylene, 1,2-propylene, 1,3-propylene, 2-methyl-1,3-propylene, 2-ethyl-1,3-propylene, 1,4-butylene, 1,5-pentylene, 2-methyl-1,5-pentylene, 1,6-hexylene and 3-oxa-1,5-pentylene.

Non-limiting specific examples of N-vinylcarboxamides of formula (I) are N-vinylformamide, N-vinylacetamide, N-vinylpropionamide, N-vinylbutyramide, N-vinylisobutyramide, N-vinyl-2-ethylhexanamide, N-vinyldecanamide, N-vinyldodecanamide, N-vinylstearamide, N-methyl-N-vinylformamide, N-methyl-N-vinylacetamide, N-methyl-N-vinylpropionamide, N-methyl-N-vinylbutyramide, N-methyl-N-vinylisobutyramide, N-methyl-N-vinyl-2-ethylhexanamide, N-methyl-N-vinyldecanamide, N-methyl-N-vinyldodecanamide, N-methyl-N-vinylstearamide, N-ethyl-N-vinylformamide, N-ethyl-N-vinylacetamide, N-ethyl-N-vinylpropionamide, N-ethyl-N-vinylbutyramide, N-ethyl-N-vinylisobutyramide, N-ethyl-N-vinyl-2-ethylhexanamide, N-ethyl-N-vinyldecanamide, N-ethyl-N-vinyldodecanamide, N-ethyl-N-vinylstearamide, N-isopropyl-N-vinylformamide, N-isopropyl-N-vinylacetamide, N-isopropyl-N-vinylpropionamide, N-isopropyl-N-vinylbutyramide, N-isopropyl-N-vinylisobutyramide, N-isopropyl-N-vinyl-2-ethylhexanamide, N-isopropyl-N-vinyldecanamide, N-isopropyl-N-vinyldodecanamide, N-isopropyl-N-vinylstearamide, N-n-butyl-N-vinylformamide, N-n-butyl-N-vinylacetamide, N-n-butyl-N-vinylpropionamide, N-n-butyl-N-vinylbutyramide, N-n-butyl-N-vinylisobutyramide, N-n-butyl-N-vinyl-2-ethylhexanamide, N-n-butyl-N-vinyldecanamide, N-n-butyl-N-vinyldodecanamide, N-n-butyl-N-vinylstearamide, N-vinylpyrrolidone, N-vinyl-2-piperidone and N-vinylcaprolactam.

Particularly preferred polymers for use in the present invention include polymers which comprise monomer units of one or more unsubstituted or substituted N-vinyllactams, preferably those having from about 4 to about 8 ring members such as, e.g., N-vinylcaprolactam, N-vinyl-2-piperidone and N-vinylpyrrolidone. These polymers include homo- and copolymers. In the case of copolymers (including, for example, random, block and graft copolymers), the N-vinyllactam (e.g., N-vinylpyrrolidone) units are preferably present in an amount of at least about 10 mole-%, e.g., at least about 30 mole-%, at least about 50 mole-%, at least about 70 mole-%, at least about 80 mole-%, or at least about 90 mole-%. By way of non-limiting example, the comonomers may comprise one or more of those mentioned in the preceding paragraphs, including monomers without functional group (e.g., ethylene, propylene, styrene, etc.), halogenated monomers, etc.

If the vinyllactam (e.g., vinylpyrrolidone) monomers (or at least a part thereof) carry one or more substituents on the heterocyclic ring, non-limiting examples of such substituents include alkyl groups (for example, alkyl groups having from 1 to about 12 carbon atoms, e.g., from 1 to about 6 carbon atoms such as, e.g., methyl, ethyl, propyl and butyl), alkoxy groups (for example, alkoxy groups having from 1 to about 12 carbon atoms, e.g., from 1 to about 6 carbon atoms such as, e.g., methoxy, ethoxy, propoxy and butoxy), halogen atoms (e.g., F, Cl and Br), hydroxy, carboxy and amino groups (e.g., dialkylamino groups such as dimethylamino and diethylamino) and any combinations of these substituents.

Non-limiting specific examples of vinyllactam polymers for use in the present invention include homo- and copolymers of vinylpyrrolidone which are commercially available from, e.g., International Specialty Products (www.ispcorp.com). In particular, these polymers include (a) vinylpyrrolidone homopolymers such as, e.g., grades K-15 and K-30 with K-value ranges of from 13-19 and 26-35, respectively, corresponding to average molecular weights (determined by GPC/MALLS) of about 10,000 and about 67,000;

(b) alkylated polyvinylpyrrolidones such as, e.g., those commercially available under the trade mark GANEX® which are vinylpyrrolidone-alpha-olefin copolymers that contain most of the alpha-olefin (e.g., about 80% and more) grafted onto the pyrrolidone ring, mainly in the 3-position thereof; the alpha-olefins may comprise those having from about 4 to about 30 carbon atoms; the alpha-olefin content of these copolymers may, for example, be from about 10% to about 80% by weight;

(c) vinylpyrrolidone-vinylacetate copolymers such as, e.g., random copolymers produced by a free-radical polymerization of the monomers in a molar ratio of from about 70/30 to about 30/70 and having weight average molecular weights of from about 14,000 to about 58,000;

(d) vinylpyrrolidone-dimethylaminoethylmethacrylate copolymers;

(e) vinylpyrrolidone-methacrylamidopropyl trimethylammonium chloride copolymers such as, e.g., those commercially available under the trade mark GAFQUAT®;

(f) vinylpyrrolidone-vinylcaprolactam-dimethylaminoethylmethacrylate terpolymers such as, e.g., those commercially available under the trade mark GAFFIX®;

(g) vinylpyrrolidone-styrene copolymers such as, e.g., those commercially available under the trade mark POLECTRON®; a specific example thereof is a graft emulsion copolymer of about 70% vinylpyrrolidone and about 30% styrene polymerized in the presence of an anionic surfactant;

(h) vinylpyrrolidone-acrylic acid copolymers such as, e.g., those commercially available under the trade mark ACRYLIDONE® which are produced in the molecular weight range of from about 80,000 to about 250,000.

Solvent for Metal Compound

The solvent for the metal compound may be a single solvent or a mixture of two or more solvents/diluents (collectively referred to herein as "solvent" or "solvent for the metal compound"). The solvent is preferably capable of dissolving a significant amount of the metal compound at room temperature and/or at the temperature that the solution of the metal compound is intended to have when it is combined with the heated polyol solution. Usually the solvent will dissolve the metal compound at room temperature in an amount of at least about 1 g/l, e.g., at least about 5 g/l, or at least about 10 g/l. Preferably, the metal compound dissolves in the solvent in an amount of at least about 50 g/l, e.g., at least about 100 g/l, at least about 200 g/l, or at least about 300 g/l. In this regard, it is to be appreciated that one or more components of the solvent may be poor solvents for the metal compound as long as the entirety of the solvent, i.e., all components thereof, are capable of dissolving the metal compound to the desired extent. The solvent for the metal compound should preferably also be miscible with the polyol of the heated solution to at least some extent. Also, the solvent for the metal compound is preferably of high purity. This applies also to any other liquids/solvents that are used in the process of the present invention.

It is to be understood that the solution of the metal compound may still contain some undissolved metal compound, although this is not preferred. By way of non-limiting example, not more than about 20 weight percent, e.g., not more than about 10 weight percent, or not more than about 5 weight percent, of the metal compound may be present in undissolved form. Preferably, the amount of undissolved metal compound is not higher than about 1 weight percent, even more preferred not higher than about 0.1 weight percent. Most preferably, the solution is substantially free of undissolved metal compound (e.g., not higher than about 0.01 weight percent, or not higher than about 0.001 weight percent of undissolved metal compound). If undissolved metal compound is present, it is preferred for it to be dissolved substantially immediately upon contact with the heated solution, for example, within less than about one minute (e.g., less than about 30 seconds). Especially in cases where the temperature difference between the solution of the metal compound and the heated solution is large (e.g., larger than about 40° C.), it may be particularly advantageous to employ a highly concentrated and in particular, a substantially saturated solution of the metal compound (preferably in a good solvent therefor) in order to keep the temperature drop relative to the temperature of the heated solution upon combining the solutions small.

In a preferred aspect of the method of the present invention, the solvent for the metal compound is or at least comprises one or more polyols, preferably the same polyol(s) that is/are present in the heated solution. It is noted however, that the use of one or more polyols for dissolving the metal compound is not mandatory. Other solvents may be used as well, such as, e.g., protic and aprotic polar solvents. Non-limiting examples of such solvents include aliphatic, cycloaliphatic and aromatic alcohols (the term "alcohol" as used herein is used interchangeably with the terms "monoalcohol" and "monohydric alcohol") such as, e.g., ethanol, propanol, butanol, pentanol, cyclopentanol, hexanol, cyclohexanol, octanol, decanol, isodecanol, undecanol, dodecanol, benzyl alcohol, butyl carbitol and the terpineols, ether alcohols such as, e.g., the monoalkyl ethers of diols such as, e.g., the $C_{1-6}$ monoalkyl ethers of $C_{1-6}$ alkanediols and polyetherdiols derived therefrom (e.g., the monomethyl, monoethyl, monopropyl and monobutyl ethers of ethylene glycol, diethylene glycol, triethylene glycol, propylene glycol, dipropylene glycol, 1,3-propanediol, and 1,4-butanediol such as, e.g, 2-methoxyethanol, 2-ethoxyethanol, 2-propoxyethanol and 2-butoxyethanol), aminoalcohols such as, e.g., ethanolamine, amides such as, e.g., dimethylformamide, dimethylacetamide 2-pyrrolidone and N-methylpyrrolidone, esters such as, e.g., ethyl acetate and ethyl formate, sulfoxides such as, e.g., dimethylsulfoxide, ethers such as, e.g., tetrahydrofuran and tetrahydropyran, and water. These and other suitable solvents may be used alone or as a mixture of two or more thereof and/or in combination with one or more polyols. By the same token, it is possible for the heated solution to comprise one or more solvents in addition to the one or more polyols included therein. By way of non-limiting example, the heated solution may additionally comprise solvents such as those that may be present in the solution of the metal compound. However, in the combined solutions (solution of metal compound and heated solution) the concentration of polyol(s) should be sufficiently high to bring about a reduction of at least a substantial portion (and preferably, substantially all) of the metal compound within a commercially acceptable period of time (for example, within not more than about 24 hours, preferably not more than about 12 hours or not more than about 6 hours) when the mixture is heated to a temperature that does not cause a substantial decomposition of any of the components that are present in the mixture.

Temperature

The temperature of the heated solution is preferably at least about 60° C., for example, at least about 70° C., at least about 80° C., at least about 85° C., at least about 90° C., at least about 100° C., at least about 110° C., or at least about 120° C. On the other hand, the temperature of the heated solution will usually be not higher than about 180° C., e.g., not higher than about 170° C., not higher than about 160° C., not higher than about 150° C., or not higher than about 140° C. The most suitable temperature of the heated solution is at least in part determined by factors such as the boiling point of the solvent(s) included therein (i.e., the boiling point of at least the polyol), the thermal stability of the adsorptive substance, the reactivities of the metal compound and the polyol, and the temperature of the solution of the metal compound and the volume thereof relative to the heated solution.

The temperature of the second solution used in the process of the present invention, i.e., the solution of the metal compound, will usually be not higher than that of the heated solution and will frequently be not higher than about 50° C., e.g., not higher than about 40° C., or not higher than about 30° C. On the other hand, too low a temperature may increase the viscosity of the solution and/or reduce the solubility of the metal compound to an undesirable degree. Usually, the temperature of the solution will be about room temperature. Particularly in cases where the metal compound is dissolved in a solvent that comprises one or more polyols which are capable of reducing the metal compound, it is advantageous to keep the solvent at a temperature at which the rate of the reaction between the metal compound and the polyol is low in order to substantially prevent a reduction of the metal compound by the polyol component while the metal compound or at least a part thereof is still present in the solid state. Even if all or almost all of the metal compound is present in dissolved form, a substantial reaction thereof with the polyol component in the absence of the adsorptive substance is undesirable, wherefore the temperature of a polyol containing solution of the metal compound prior to the combination thereof with the heated solution should preferably be kept low, in particular when highly reactive polyols and/or highly reactive metal compounds are present. One of skill in the art will appreciate that if the solution of the metal compound does not comprise a substance (solvent) that will reduce or otherwise react with the metal compound to any substantial extent even at an elevated temperature, the temperature of the solution of the metal compound may even be higher than that of the heated solution and will preferably be close to (e.g., within about 110° C.), for example, about the same as the temperature of the heated solution so that upon mixing these two solution there is substantially no temperature change in the system.

In a preferred aspect of the process of the present invention, the temperature of the solution of the metal compound will be not substantially higher than about 40° C. and the heated solution will be at a temperature of at least about 80° C.

Mixing

The rate at which the solution of the metal compound and the heated solution are combined in the process of the present invention is preferably as high as possible. By way of non-limiting example, the two solutions will usually be completely combined within not more than about 5 minutes, preferably within not more than about 2 minutes, e.g., within not more than about 1 minute, within not more than about 30 seconds, within not more than about 15 seconds, or within not more than about 5 seconds. Most preferably, the solutions are combined virtually instantaneously, such as by a one-shot addition of one of the solutions to the other solution, e.g., by a one-shot addition of the solution of the metal compound to the heated solution.

It is also preferred according to the present invention to promote the complete mixing of the two solutions, for example, by agitation such as, e.g., by (preferably vigorous) stirring, shaking and/or sonication of the combined solutions.

Ratio and Total Volume of Solutions

The total volume of the solution of the metal compound and the heated solution are not particularly limited. However, with increasing amounts of the employed metal compound it will become increasingly desirable to keep the total volume of the solutions small so as to keep the volume of the reaction mixture and, thus the required size of the reaction vessel as small as possible and also to keep the amount of liquids that need to be discarded/recycled after the reaction is completed at a minimum. Accordingly, provided the solubility of the metal compound in the selected liquid components of the reaction mixture is high enough, the combined volume of the two solutions per one mole of employed metal compound will usually be not larger than about 10 liters, e.g., not larger than about 8 liters, not larger than about 6 liters, not larger than about 5 liters, or not larger than about 4 liters. On the other hand, for reasons of, inter alia, solubility, the combined volume will usually be not smaller than about 1 liter, e.g., not smaller than about 2 liters, or not smaller than about 3 liters per one mole of employed metal compound. Of course, (considerably) smaller or larger combined volumes than those indicated herein may sometimes be more desirable and/or advantageous.

The volume ratio of the two solutions is not particularly limited, either. The most desirable volume ratio is influenced by several factors such as, e.g., the volume of solvent that is to dissolve the metal compound, the temperature difference between the solutions, and the desire to keep the total volume of the liquid phase as low as possible (e.g., for the reasons stated above). In many cases the volume ratio of the heated solution and the solution of the metal compound will be not higher than about 10:1, e.g., not higher than about 8:1, or not higher than about 6:1. On the other hand, the volume ratio will often be not lower than about 1:1, e.g., not lower than about 2:1, not lower than about 3:1, or not lower than about 4:1. Of course, there may be situations where lower or higher volume ratios than those indicated herein may be more advantageous and/or desirable. Especially in cases where the temperature difference between the solution of the metal compound and the heated solution is large (e.g., higher than about 40° C.), it will often be advantageous to use a relatively high volume ratio in order to keep the temperature drop relative to the temperature of the heated solution upon combining the solutions small. This may be accomplished, for example, by employing a concentrated (e.g., saturated) solution of the metal compound in a good solvent therefor.

Ratio of Metal Compound and Adsorptive Substance

The most desirable ratio of the metal compound and the adsorptive substance is a function of a variety of factors. In this regard, it is to be appreciated that the adsorptive substance will generally have multiple functions. These functions include, of course, a substantial prevention of an agglomeration of the nanoparticles and, as a result thereof, facilitating an isolation of the nanoparticles from the reaction mixture, ensuring a substantial redispersibility of the isolated nanoparticles and a stabilization of dispersions comprising these nanoparticles. Another function of the adsorptive substance usually comprises assisting in the control of the size and shape of nanoparticles during the reduction of the metal compound. For example, if the amount of adsorptive substance is not sufficient to shield the growing nanoparticles completely, the formation of particles with a high aspect ratio such as, e.g., nanorods and/or nanowires and/or irregularly shaped particles may be observed. Also, under otherwise identical conditions, the average size of the formed nanoparticles will usually decrease with increasing molar ratio of adsorptive substance and metal compound. It has been found that under otherwise identical conditions, the rapid mixing of the solution of the metal compound and the heated solution according to the process of the present invention allows to obtain substantially the same results with respect to the control of the size, the size distribution and/or the shape of the particles as the known method with its gradual dissolution/reaction of the metal compound in the presence of the adsorptive compound, but at a (substantially) lower molar ratio of the adsorptive compound and the metal compound than required in the known method. At any rate, the adsorptive substance should be present in at least the amount that is sufficient to substantially prevent an agglomeration of the nanoparticles. This amount is at least in part dependent on the size of the metal cores of the formed nanoparticles.

By way of non-limiting example, a batch of dry nanoparticles will usually require a minimum of surface passivation or surface coverage by the adsorptive substance in order to be redispersible. A simple rule of thumb is that the smaller the particle size the larger the surface area and thus, the more adsorptive substance is required for complete coverage. Depending on the adsorptive substance, one can make some simple assumptions regarding the thickness of a monolayer of adsorptive substance that is adsorbed on the surface of the metal cores of the nanoparticles. In addition, one may also assume that a minimum of one monolayer of adsorptive substance around a metal core is needed to allow for complete dispersibility of dry particles. Usually, not more than about 10 monolayers (and often not more than about 5 monolayers or even not more than about 2 monolayers) of adsorptive substance are needed to redisperse and stabilize a metal nanoparticle in solution. With this simple model one may make a rough estimate of the amount of adsorptive substance that is needed to (re)disperse metal nanoparticles of any size. For example, for PVP as the adsorptive substance, one may assume that the thickness of a monolayer thereof is about 1 nm. Based on this model and using the densities of Ag (10.5 g/cm$^3$) and PVP (1.0 g/cm$^3$) one can calculate that for a PVP coated sphere-shaped silver core having a diameter of 20 nm the minimum amount of PVP needed to disperse a dry particle is about 3.2% by weight (one monolayer). Preferably, not more than 10 monolayers or 41% by weight of PVP will be present. Most preferably, about 4 to about 8 monolayers or about 14.8% to about 32.5% by weight of PVP will be used. For a 50 nm PVP-coated sphere-shaped Ag core, a minimum of about 1.3% by weight of PVP will be needed to cover the nanoparticle completely with a monolayer. No more than about 14.8% by weight or 10 monolayers will usually be needed. Most preferably about 5.3 to about 11.5% by weight of PVP is used (for about 4 to about 8 monolayers).

If the adsorptive substance is or comprises a low molecular weight compound (i.e., one or more low molecular weight compounds, collectively referred to herein as a single compound), the molar ratio of the low molecular weight compound and the metal in the reaction mixture will often be at least about 3:1, e.g., at least about 5:1, or at least about 10:1. While there is no particular upper limit for this ratio, for practical reasons and reasons of economic efficiency one will usually avoid a substantially higher amount of adsorptive substance than the amount that is needed for obtaining particles in the desired size range and/or for substantially preventing an agglomeration of the nanoparticles.

If the adsorptive substance is or comprises a polymer (i.e., one or more polymers, collectively referred to herein as a single polymer), the molar ratio in the reaction mixture of the monomer units of the polymer (and preferably of only those monomer units that are capable of being adsorbed on the nanoparticles), and the metal will often be at least about 3:1, e.g., at least about 5:1, at least about 6:1, at least about 8:1, or at least about 10:1. However, for practical reasons (in particular in view of the viscosity increasing effect of certain polymers) and for reasons of economic efficiency (excess adsorptive substance, i.e., substance that will not be adsorbed may have to be removed and discarded/recycled later) this ratio will usually be not higher than about 100:1, e.g., not higher than about 80:1, not higher than about 50:1, not higher than about 30:1, or not higher than about 20:1.

Reaction Time and Temperature

The reaction between the metal compound and the polyol will usually take some time (e.g., one or more hours) before a substantial percentage of the employed metal compound has been converted to metal nanoparticles. The reaction rate depends, inter alia, on the temperature at which the mixed solutions are kept. It will usually be advantageous to heat the mixed solutions to an elevated temperature (if they are not at the desired temperature already) and to keep them at this temperature for a sufficient period to convert at least a substantial portion of, and preferably substantially the entire metal compound (e.g., at least about 90%, or at least about 95% thereof) to metal nanoparticles. The temperature that is needed to achieve a desired degree of conversion within a predetermined period of time depends, inter alia, on the reactivities and concentrations of the reactants. Of course, the reaction temperature should not be so high as to cause a more than insignificant decomposition of the various components of the reaction mixture (e.g., of the adsorptive substance). Also, the temperature will usually be not significantly higher than the boiling point of the lowest-boiling component of the reaction mixture, although this is not mandatory, especially if the reaction mixture is kept under a higher than atmospheric pressure, e.g., in an autoclave. In many cases, the reaction mixture will be heated to/kept at a temperature of at least about 80° C., e.g., at least about 90° C., at least about 100° C., at least about 110° C., or at least about 120° C. On the other hand, it will usually be advantageous for the temperature of the reaction mixture to not exceed about 200° C., e.g., to not exceed about 180° C., to not exceed about 160° C., to not exceed about 150° C., or to not exceed about 140° C.

Especially (but not only) in cases where the volume of the liquid phase is kept relatively small relative to the amount of components dissolved therein and/or the reaction temperature is relatively close to the boiling point of the liquid phase or a component thereof, respectively, and no reflux is provided for, it may be advantageous to add additional solvent, in particular, a polyol to the reaction mixture.

One of skill in the art will understand that the process of the present invention can be carried out batch-wise, and also semi-continuously or continuously. By way of non-limiting example, in the case of a continuous process, separate feeds of the solution of the metal compound and the heated solution may be introduced continuously into a constant temperature reactor. Reaction product is continuously withdrawn at the same rate as the rate at which the two feed streams are introduced into the reactor. Alternatively, the feed streams may be premixed before they enter the reactor as a single feed stream. The required residence time in the reactor can be calculated on the basis of the reaction rate at the selected temperature, the desired degree of conversion, etc.

Optional Further Processing

Once the desired degree of conversion of the metal compound is achieved the reaction mixture is preferably cooled to room temperature. Cooling can be accomplished in any suitable manner, e.g., by cooling the reaction vessel with a cooling medium such as, e.g., water (forced cooling). Further, the reaction mixture may simply be allowed to cool to room temperature in the ambient atmosphere.

Preferably after the cooling of the reaction mixture to room temperature the formed nanoparticles may be separated from the liquid phase of the reaction mixture. This can be accomplished, for example, in the various ways of separating a solid from a liquid that are known to those of skill in the art. Non-limiting examples of suitable separation methods include filtration, centrifugation, chromatographic methods, electrophoretic techniques, etc. Because the nanoparticles have a very small mass, do not substantially agglomerate and have adsorptive substance thereon that will usually interact with the components of the liquid phase, the nanoparticles will often not settle, i.e., separate from the liquid phase by themselves, at least not to a sufficient extent and/or within a desirably short period of time. A preferred method of achieving a separation of the nanoparticles from the liquid phase of the reaction mixture comprises the addition of one or more nanoparticle-precipitating substances to the reaction mixture. The suitability of a substance for causing a precipitation of the nanoparticles will usually depend, inter alia, on the nature of the adsorptive substance. A non-limiting example of a nanoparticle-precipitating substance includes a substance that interferes with the (electronic and/or steric) interaction between the adsorptive substance that is adsorbed on the surface of the nanoparticles and one or more components of the liquid phase. A preferred example of such a nanoparticle-precipitating substance is a solvent in which the adsorptive substance is substantially insoluble or at least only poorly soluble. The nanoparticle-precipitating substance is preferably substantially soluble in and/or miscible with the liquid phase of the reaction mixture, in particular, the polyol(s). Often this substance will comprise an aprotic solvent, preferably a polar aprotic solvent. The term "aprotic" characterizes a solvent that is not capable of releasing (dissociating into) protons. Non-limiting examples of such solvents include ethers (e.g., diethyl ether, tetrahydrofuran, tetrahydropyran, etc.), sulfonyl compounds and particularly, carbonyl compounds such as, e.g., ketones, esters and amides, especially ketones. Preferred ketones comprise from 3 to about 8 carbon atoms such as, e.g., acetone, butanone, the pentanones, the hexanones, cyclopentanone and cyclohexanone. Of course, mixtures of aprotic solvents may be used as well.

The nanoparticle-precipitating substance(s) will usually be employed in an amount which is sufficient to cause a precipitation of at least a substantial portion of the nanoparticles that are present in the reaction mixture, e.g., at least about 90%, at least about 95%, or at least about 98% of the nanoparticles.

While the addition of a nanoparticle-precipitating substance in a sufficient quantity may result in a precipitation, the precipitation will frequently be unsatisfactory, particularly in cases where the volume of the liquid phase of the reaction mixture is substantial (e.g., at least about 1 liter, at least about 2 liters, or at least about 3 liters) and/or the concentration of the adsorptive substance and/or the nanoparticles in the liquid phase is relatively high. For example, the addition of the nanoparticle-precipitating substance in a sufficient quantity to cause a precipitation of substantially all of the nanoparticles may frequently cause a concomitant precipitation of at least a substantial portion of the excess (unbound) adsorptive substance that is present in the reaction mixture. The precipitated adsorptive substance may form an oil which prevents or at least significantly interferes with (slows down) a settling of the nanoparticles, thereby making the separation of the nanoparticles from the liquid phase difficult, if not impossible.

It has been found that the required settling times can be shortened and/or the formation of oily precipitates can be significantly reduced or completely eliminated if before and/or during and/or after the addition of the nanoparticle-precipitating substance a protic solvent is added to the reaction mixture. The term "protic" characterizes a solvent that is capable of releasing (dissociating into) protons. Preferably, the protic solvent comprises a hydroxyl-containing compound, in particular, an alcohol such as, e.g., ethanol, propanol, butanol and the like, and/or a polyol, e.g., any of the polyols that may be used as a reactant in the process of the present invention. Water may also be used as the (or a part of the) protic solvent. Preferably, the protic solvent is or comprises one or more of the polyols that are present in the reaction mixture. Details regarding the addition of the protic solvent may be taken from U.S. Provisional Application Ser. No. 60/643,629 entitled "Separation of Metal Nanoparticles," the entire disclosure whereof is expressly incorporated by reference herein.

According to a preferred aspect of the process of the present invention, the precipitated nanoparticles are isolated by removing the liquid phase of the reaction mixture therefrom. Any process that is suitable for removing a liquid from a solid can be used for this purpose. Non-limiting examples of such a process include decantation, filtration, centrifugation and any combinations thereof. Preferably, the nanoparticles are isolated by centrifugation (including, for example, continuous centrifugation), filtration (including ultrafiltration, diafiltration etc.) or a combination of two or more of these processes.

With respect to continuous centrifugation, this can be accomplished in different ways. For example, one may use a unit (centrifuge) which is optimized for affording at least three different products in different sections of the unit, for example, a supernatant in a top section, undesirably large particles in a bottom section and desired product (e.g., nanoparticles in the desired particle size range) in a middle section. Each of these three products may be withdrawn continuously from the centrifuge while a fresh mixture for separation is continuously introduced into the centrifuge. According to another alternative of the continuous centrifugation, two or more centrifuges may be arranged in series, each of them being optimized for the removal of one kind of separation product, e.g., supernatant, undersized particles, particles in the desired particle size range, oversized particles, etc.

Regarding the ultrafiltration/diafiltration of nanoparticles reference may be made, for example, to U.S. Pat. Nos. 6,328, 894, 5,879,715, 6,245,494 and 6,811,885, the entire disclosures whereof are incorporated by reference herein. Briefly, ultrafiltration and diafiltration use a filtration under pressure through a membrane which allows only components of a certain maximum size to pass therethrough. In the present case, the metal nanoparticles will be retained by the membrane while preferably a major part or substantially all of the contaminants (e.g., dissolved inorganic matter, excess adsorptive substance, etc.) and the like will be able to pass through the membrane. Any size of membrane as well as any channel (pore) size thereof can be used as long as the process permits a preferably substantial removal of contaminants and the like while retaining substantially all of the nanoparticles: In a preferred aspect, the membrane may vibrate to substantially reduce clogging and/or to permit a higher permeate flow rate. Also, the ultrafiltration/diafiltration may be pressure-driven (i.e., involving pressing through the membrane) or vacuum-driven (i.e., involving sucking through the membrane). Membrane configurations include, but are not limited to, flat sheet membranes, cross flow membranes, spiral wound tubes, or hollow fiber tubes. For example, a three compartment through-flow cell comprising two membranes may be used. Non-limiting examples of membrane materials include polymeric and ceramic materials such as, e.g., polysulfone, polyethersulfone, sulfonated polysulfone, polyamide, cellulose ester (e.g., cellulose acetate), and metal oxides such as the oxides of titanium, zirconium, silicon, aluminum and combinations of two or more thereof. By way of non-limiting example, the membrane may have a molecular weight cutoff (MWCO) in the range of from about 10,000 to about 1,000,000, e.g., about 50,000, about 100,000, about 200,000 or about 500,000, and/or a pore size of from about 0.01 µm to about 1 µm (preferably at least about 0.02 µm and not higher than about 0.5 µm) and/or a lumen of from about 0.1 mm to about 5 mm (preferably at least about 2 mm and not more than about 3 mm).

Any type of ultrafiltration/diafiltration process may be used as long as the process is capable of removing a substantial portion of the contaminants and the like (e.g., at least about 70%, at least about 80%, at least about 90%, or at least about 95%) and in particular, that part of the adsorptive substance that is not adsorbed on the surface of the nanoparticles while retaining substantially all of the nanoparticles. By way of non-limiting example, a cross-flow separation process may be used.

The nanoparticles that have been separated from the liquid phase are preferably subjected to a washing operation to remove at least a substantial portion of the impurities that may still be associated therewith such as, e.g., materials that are not adsorbed on the surface of the nanoparticles to any significant extent. For example, these impurities may include inorganic salts formed during the reduction of the metal compound, residual solvent(s) from the precipitation step and excess adsorptive substance, i.e., adsorptive substance that is merely present as an impurity without being adsorbed on the nanoparticles. The washing liquid used for the washing operation preferably is or comprises a solvent that is capable of dissolving the impurities associated with the nanoparticles, in particular, excess adsorptive substance. By way of non-limiting example, the washing liquid may comprise water and/or an organic solvent, for example, a polar organic solvent. One of skill in the art will appreciate that the most desirable washing liquid(s) for a specific case will to a large extent depend on the nature of the impurities to be removed, e.g., polar vs. apolar, inorganic vs. organic, etc. In some cases it may be advantageous to use two or more different washing liquids (preferably successively or with a concentration gradient) for obtaining the best results. Non-limiting examples of a washing liquids include liquids which comprise or consist of water and/or one or more protic organic solvents such as, e.g., a hydroxyl-containing compound, preferably, an alcohol and/or a polyol. Illustrative and non-limiting examples of alcohols and polyols that may be used for the washing operation include aliphatic alcohols having from 1 to about 12 carbon atoms such as, e.g., methanol, ethanol, propanol, isopropanol, butanol, pentanol, cyclopentanol, hexanol, cyclohexanol, octanol, decanol, dodecanol and the like, and polyols having from 1 to about 4 hydroxyl groups and from 2 to about 12 carbon atoms such as, e.g., ethylene glycol, propylene glycol, glycerol and the like. A preferred solvent for use in the washing operation includes ethanol, which may be used alone or in combination with other solvents (e.g., water). Of course, non-protic solvents may also be useful for the washing operation. Non-limiting examples thereof include ketones such as, e.g., acetone and butanone, ethers such as, e.g., diethylether and tetrahydrofuran, esters such as, e.g., ethyl acetate, amides such as, e.g., dimethylformamide and dimethylacetamide, sulfoxides such as, e.g., dimethyl sulfoxide, and optionally halogenated hydrocarbons such as, e.g., hexane, cyclohexane, heptane, octane, petrol ether, methylene chloride, chloroform, toluene, the xylenes, etc. Combinations of two or more of these solvents may, of course, also be used.

The washing operation may, for example, be carried out by dispersing the isolated crude nanoparticles obtained after, e.g., a filtration (including, e.g., a diafiltration/ultrafiltration) and/or centrifugation of the reaction mixture in a washing liquid, followed by a separation of the particles from the washing liquid by, e.g., filtration and/or centrifugation. This process may optionally be repeated one or more times. The washed (purified) nanoparticles may thereafter be dried (e.g., under reduced pressure and/or at a temperature that does not adversely affect the adsorptive substance to any significant extent) and thereafter stored and/or shipped. Even after storage for extended periods the dry particles can be redispersed in a desired liquid to form a dispersion (e.g., a printing ink) that is substantially stable over several days or even weeks (for example, wherein not more than about 20%, e.g., not more than about 10%, or not more than about 5% of the nanoparticles have settled after storing the dispersion at room temperature for at least one day, e.g., at least two days, or at least one week).

In a preferred aspect of the present invention, the further processing of the nanoparticle containing reaction mixture obtained after carrying out the reduction of the metal compound may be carried out by using substantially only ultrafiltration/diafiltration. In particular, the use of ultrafiltration/dialfiltration makes it possible to dispense with the addition of a nanoparticle-precipitating substance to the reaction mixture and even allows combining the separation and washing operations of the nanoparticles in a single operation. Further, at least the last liquid that is added to the nanoparticles before the ultrafiltration/diafiltration thereof is completed may be selected to be the vehicle of a desired dispersion of the nanoparticles (for example, of a printing ink) or a component thereof, thereby making it possible to convert the nanoparticle containing reaction mixture into the desired nanoparticle containing product in a single unit/operation. Also, one or more additives may be incorporated in the washing liquid and/or the liquid that is intended to be the vehicle of the desired dispersion or a component thereof. For example, in order to keep the dissolution of adsorbed adsorptive substance at a minimum it may be advantageous to add some adsorptive substance to, e.g., the washing liquid. Also, one or more additives whose presence may be desirable in the final nanoparticle containing product (e.g., a printing ink) may be incorporated into the liquid used in the final step(s) of a diafiltration operation (such as, e.g., adhesion promoters, humectants, etc.).

By way of non-limiting example, the diafiltration/ultrafiltration may be carried out by placing the nanoparticle containing reaction mixture in a diafiltration unit and concentrating the reaction mixture therein to a predetermined fraction of the original volume by pressing (application of pressure) or drawing (application of vacuum) the reaction mixture through one or more ultrafiltration membranes of suitable MWCO/pore size. Thereafter, a first liquid that is capable of dissolving impurities and contaminants present in the reaction mixture (in particular, excess adsorptive substance) may be added to the concentrated reaction mixture (e.g., in an amount sufficient to restore the originally employed volume of the reaction mixture) and the resulting mixture may be concentrated in the same way as the originally employed reaction mixture. A second liquid which is capable of dissolving impurities and contaminants and which may be the same as or different from the first liquid may be added to the resulting concentrate and the resulting mixture may be concentrated again. This process may be repeated as often as necessary with a third, fourth, etc. liquid. Alternatively, before concentrating the original reaction mixture a predetermined amount of the first liquid may be added thereto and the resulting mixture may be concentrated, e.g., until the original volume of the reaction mixture is reached again. Then the second liquid may be added and a second concentration operation may be carried out, etc. Of course, any combination of the two alternatives described above may be used as well. For example, the original reaction mixture may be concentrated first and then the first liquid may be added in an amount which results in a volume of the resultant mixture which exceeds the volume of the original reaction mixture, whereafter the resultant mixture may be concentrated to the volume of the original reaction mixture, whereafter a second liquid may be added, etc. At the end of each of these alternative ways of isolating/purifying the metal nanoparticles by ultrafiltration/diafiltration the liquid may be removed partially or completely by ultrafiltration, leaving behind the purified substantially non-agglomerated metal nanoparticles with the adsorptive substance thereon, or a concentrated and stable dispersion thereof. The nanoparticles may then optionally be dried to form a powder batch of dry nanoparticles. Alternatively, the liquids that are used for the diafiltration operation may be selected such that at least at the end of the diafiltration operation the purified nanoparticles are combined with a liquid which is the vehicle or at least a part of the vehicle of a desired dispersion of the metal nanoparticles (e.g., a printing ink). The liquids which may be used for carrying out the diafiltration/ultrafiltration include those which have been mentioned above in the context of the separation of the nanoparticles from the liquid phase and the washing of the separated nanoparticles.

It is to be appreciated that the use of ultrafiltration/diafiltration is advantageous not only for the separation and/or purification of metal nanoparticles that have been produced by the process of the present invention but is a procedure which is of general applicability for separating inorganic nanoparticles and, in particular, metal nanoparticles that have a polymeric substance (e.g., an anti-agglomeration substance as used in the process of the present invention) adsorbed on their surface from a liquid which comprises a dissolved polymeric substance (either the same as or different from the adsorbed polymeric substance) and for purifying (e.g., washing) such nanoparticles and for formulating such separated/purified nanoparticles into a desired product (e.g., a dispersion).

Metal Nanoparticles

Due to the particular way of combining the metal compound and the polyol according to the process of the present invention, it is possible to control the size, the size distribution and/or the shape of the nanoparticles even on a large scale. For example particles which exhibit a high degree of uniformity in size and/or shape may be produced by the process of the present invention. For example, the process of the present invention is capable of affording particles with a substantially spherical shape. In one aspect of the present invention, at least about 90%, e.g., at least about 95% of the nanoparticles formed by the process of the present invention may be of a substantially spherical shape. In another aspect, the particles may be substantially free of micron-size particles (i.e., particles having a size of about 1 μm or above). Even more preferably, the nanoparticles may be substantially free of particles having a size (=largest dimension, e.g., diameter in the case of substantially spherical particles) of more than about 500 nm, e.g., of more than about 200 nm, or of more than about 100 nm. In this regard, it is to be understood that whenever the size and/or dimensions of the nanoparticles are referred to herein and in the appended claims, this size and these dimensions refer to the nanoparticles without adsorptive substance thereon, i.e., the metal cores of the nanoparticles. Depending on the type and amount of adsorptive substance, an entire nanoparticle, i.e., a nanoparticle which has the adsorptive substance thereon, may be significantly larger than the metal core thereof. Also, the term "nanoparticle" as used herein and in the appended claims encompasses particles having a size/largest dimension of the metal cores thereof of up to about 900 nm, preferably of up to about 500 nm. By way of non-limiting example, not more than about 5%, e.g., not more than about 2%, not more than about 1%, or not more than about 0.5% of the particles that are formed by the process of the present invention may be particles whose largest dimension (e.g., diameter) is larger than about 200 nm, e.g., larger than about 150 nm, or larger than about 100 nm. In a particularly preferred aspect, at least about 95% of the nanoparticles may have a size of not larger than about 80 nm and/or at least about 80% of the nanoparticles may have a size of from about 30 nm to about 70 nm.

In another aspect, the nanoparticles formed by the process of the present invention may have an average particle size (expressed as number average) of at least about 10 nm, e.g., at least about 20 nm, or at least about 30 nm, but preferably not higher than about 80 nm, e.g., not higher than about 70 nm, not higher than about 60 nm, or not higher than about 50 nm. The average particle sizes and particle size distributions referred to herein may be measured by conventional methods such as, e.g., by scanning electron microscopy (SEM) or tunneling electron microscopy (TEM) and refer to the metal cores.

In yet another aspect of the process of the present invention, at least about 80 volume percent, e.g., at least about 90 volume percent of the nanoparticles formed by the process of the present invention may be not larger than about 2 times, e.g., not larger than about 1.5 times the average particle size (volume average).

The reduction process of the present invention and the optional further processing of the reaction mixture obtained thereby are capable of affording large, commercially useful quantities of substantially non-agglomerated, dispersed or redispersable metal nanoparticles in a single run. For example, in batch-wise operation the process of the present invention can be carried out on a scale at which at least about 30 g, e.g., at least about 40 g, at least about 50 g, or at least about 60 g of substantially non-agglomerated, dispersed or redispersable metal (e.g., silver) nanoparticles (expressed as pure metal without adsorptive substance) are produced in a single run. In a preferred aspect, a single run will afford at least about 100 g, at least about 200 g, or at least about 500 g of substantially non-agglomerated, dispersed or redispersable metal nanoparticles.

Further, in one aspect of the present invention a concentrated batch of metal nanoparticles—a so-called "masterbatch"—may be produced which may be a liquid or solid at room temperature and comprises a high concentration of metal nanoparticles and may be stored for an extended period of time and subsequently redispersed by adding solvents and/or diluents. By way of non-limiting example, the masterbatch may comprise adsorptive substance and metal nanoparticles alone, or the masterbatch may comprise metal nanoparticles, adsorptive substance and solvents/diluents. In another embodiment of this invention, a concentrated metal nanoparticle batch may be further concentrated by removing the solvent to produce a batch of dry metal nanoparticles comprised primarily of metal nanoparticles and adsorptive substance, which batch can be substantially completely redispersed to form a stable dispersion (e.g., a desired printing ink) on adding a suitable solvent or diluent liquid. Due to, for example, the reduced volume thereof, a dry masterbatch is particularly advantageous for shipping and storage over an extended period of time. In this regard, it is to be appreciated that the adsorptive substance on the surface of the metal nanoparticles will usually not only substantially prevent an (irreversible) agglomeration of the nanoparticles, but also increase the shelf life of the nanoparticles and in particular, of dry nanoparticles by shielding to at least some extent the surfaces of the metal cores of these nanoparticles from an attack by oxygen (oxidation), heat, harmful radiation (e.g., UV rays) and the like.

Preferred Aspects

A preferred aspect of the process of the present invention comprises the production of silver nanoparticles by the rapid mixing a solution of at least about 0.1 mole of a silver compound with a heated solution of a polyol and a vinyl pyrrolidone polymer. In the following description this aspect will be discussed with respect to particularly advantageous features thereof.

Non-limiting examples of silver compounds for use in the preferred aspect of the process of the present invention include silver nitrate, silver acetate, silver trifluoroacetate and silver oxide. Particularly preferred is silver nitrate. Preferably, the silver compound comprises a single silver compound, although mixtures of different silver compounds and mixtures of one or more silver compounds with one or more compounds of other metals may be used as well.

The polyol(s) used in combination with the silver compound will usually have from 2 to about 4 hydroxy groups and/or from 2 to about 6 carbon atoms such as, e.g., ethylene glycol, diethylene glycol, triethylene glycol, propylene glycol, dipropylene glycol, 1,3-propanediol, 1,2-butanediol, 1,3-butanediol, 1,4-butanediol, 2,3-butanediol, glycerol, triethanolamine and trimethylolpropane. Usually, the polyol(s) will include on or more glycols, preferably at least one glycol having from 2 to about 4 carbon atoms. Preferred examples of such glycols include ethylene glycol and propylene glycol. Particularly preferred is ethylene glycol.

The vinyl pyrrolidone polymer for use in combination with the silver compound may be a vinyl pyrrolidone homopolymer (PVP) and/or a vinyl pyrrolidone copolymer. Preferably, the polymer is or at least comprises a vinyl pyrrolidone homopolymer.

The vinyl pyrrolidone polymer (and particularly, the vinyl pyrrolidone homopolymer) will usually have a weight average molecular weight of up to about 60,000, e.g., up to about 50,000, up to about 40,000, or up to about 30,000, and preferably, of not less than about 3,000, e.g., not less than about 4,000, not less than about 5,000, not less than about 8,000, or not less than about 10,000. An example of a particularly preferred vinyl pyrrolidone polymer is a vinyl pyrrolidone homopolymer (=PVP) having a weight average molecular weight of about 10,000.

The solution of the silver compound preferably comprises one or more polyols. Even more preferably, at least one of the one or more polyols is identical with at least one of the one or more polyols present in the heated solution. Most preferably, both the solution of the silver compound and the heated solution comprise ethylene glycol, which may be the only polyol used in the process of the present invention.

In another aspect of the preferred process of the present invention; no solvent other than the polyol(s) may be present in the solution of the silver compound and/or in the heated solution. Preferably, both the solution of the metal compound and the heated solution will comprise one or more polyols (e.g., ethylene glycol and/or propylene glycol) as the only liquid component.

In yet another aspect of the preferred process of the present invention, the heated solution may be at a temperature of not higher than about 150° C., preferably not higher than about 130° C., and not lower than about 80° C., preferably, not lower than about 100° C. A particularly preferred temperature of the heated solution is about 120° C.

In a still further aspect of the preferred process of the present invention, the temperature of the solution of the silver compound may be not higher than about 40° C., e.g., not higher than about 30° C., or not higher than about 25° C.

In another aspect of the preferred process of the present invention, the rapid mixing may comprise combining the solutions within not more than about 30 seconds, preferably with agitation such as, e.g., stirring, shaking and/or sonication. Preferably, the solutions are combined by a one-shot addition of one of the solutions to the other solution, in particular, by adding the solution of the silver compound to the heated solution.

In another aspect of the preferred process of the present invention, the solution of the silver compound may comprise at least about 0.5 mole of the silver compound, e.g., at least about 0.75 mole of the silver compound, or at least about 1 mole of the silver compound.

In yet another aspect of the preferred process of the present invention, the combined volume of the solution of the silver compound and the heated solution per one mole of the silver compound may not be larger than about 5 liters, e.g., not larger than about 4 liters, and may often be not smaller than about 3 liters, e.g., not smaller than about 2 liters per one mole the of silver compound.

In yet another aspect of the preferred process of the present invention, the volume ratio of the heated solution and the solution of the silver compound may be not higher than about 8:1, e.g., not higher than about 7:1, or not higher than about 6:1, and not lower than about 2:1, e.g., not lower than about 3:1, or not lower than about 4:1. A particularly preferred volume ratio is about 5:1. By way of non-limiting example, the solution of the silver compound (e.g., silver nitrate) may comprise about 1.5 mole of silver compound per liter of solvent (e.g., ethylene glycol) and the ratio of the heated solution and the solution of the silver compound may be about 5:1.

In a still further aspect of the preferred process of the present invention, the molar ratio of the vinyl pyrrolidone units in the vinyl pyrrolidone polymer (which preferably comprises or consists of a vinyl pyrrolidone homopolymer) and the silver compound will preferably be not lower than about 3:1, e.g., not lower than about 6:1, or not lower than about 10:1, and will preferably be not higher than about 100:1, e.g., not higher than about 50:1, not higher than about 20:1, or not higher than about 15:1. By way of non-limiting example, the molar ratio of vinyl pyrrolidone units of a PVP and the silver compound maybe about 12:1.

In one aspect, the preferred process of the present invention may further comprise keeping the mixed solutions at a temperature of at least about 100° C., e.g., at least about 110° C., for a sufficient period to convert a substantial portion (preferably at least about 90%, and more preferably at least about 95%, and most preferably at least about 98%) of the silver compound to silver nanoparticles. In a preferred aspect, the mixed solutions are heated at a temperature of about 120° C. for about 1 hour and/or until substantially all of silver compound is converted to nanoparticles.

In another aspect, the preferred process of the present invention may further comprise the addition of a polyol to the mixed solutions. The polyol preferably comprises or is a glycol, preferably a glycol that is already present in the mixed solutions. The amount of glycol will preferably be at least about the amount that compensates any losses of polyol due to evaporation during the heating of the mixed solutions. The polyol may be added, for example, continuously, in two or more portions or in one shot.

In another aspect, the preferred process of the present invention may further comprise allowing the heated mixture to cool to room temperature.

In yet another aspect, the preferred process of the present invention may further comprise a precipitation of formed silver nanoparticles. This precipitation preferably comprises the addition of a sufficient amount of a nanoparticle-precipitating liquid that is miscible with the one or more polyols that are present in the reaction mixture to precipitate at least a substantial portion (preferably at least about 90%) of the silver nanoparticles.

The nanoparticle-precipitating liquid will usually comprise a polar aprotic solvent such as, e.g., a ketone. A non-limiting example of a ketone is acetone.

In a preferred aspect of the precipitation of the silver nanoparticles, before and/or during and/or after the addition of the nanoparticle-precipitating liquid a polyol is added in a sufficient amount to improve the precipitation of the nanoparticles and/or the separation thereof from the liquid phase. This polyol may be or may comprise a polyol that is already present in the reaction mixture. For example, the polyol may comprise a glycol such as ethylene glycol and/or propylene glycol. By way of non-limiting example, the nanoparticle-precipitating liquid may comprise acetone and the polyol may comprise ethylene glycol.

In yet another aspect, the preferred process of the present invention may further comprise an isolation of the (precipitated) silver nanoparticles. This isolation can be accomplished by any means that are suitable for removing a liquid from a solid. However, the separation preferably includes a centrifugation (including, e.g., a continuous centrifugation) and/or an ultrafiltration and/or a diafiltration.

In a still further aspect, the preferred process of the present invention may further comprise subjecting the isolated silver nanoparticles to a washing operation with a liquid that is capable of dissolving the vinyl pyrrolidone polymer. Preferably, the liquid comprises an aliphatic alcohol such as, e.g., ethanol and/or water. The washing operation will usually remove at least a major part of the excess vinyl pyrrolidone polymer that is not adsorbed on the nanoparticles (i.e., is present merely as a contaminant). While the presence of major quantities of excess polymer may be acceptable for many applications for which the silver nanoparticles are currently intended, there are also applications in which the presence of significant amounts of excess polymer should be avoided.

In particular, the silver nanoparticles of the present invention may be used in the formulation of printing inks for various purposes and for various printing techniques such as, e.g., ink-jet printing, screen printing, intaglio printing, roll printing, lithographic printing and gravure printing. Major fields of application for these inks include electronics (e.g., for the printing of electrically conductive features and the like by, for example, ink-jet printing), graphics (e.g., decorative purposes), security features and the like. In many of these applications, the excess polymer is either acceptable or can be removed by, e.g., thermal means, for example, by heating the deposited ink to a temperature above the decomposition temperature of the polymer (which at the same time will remove the polymer that is adsorbed on the nanoparticles). The removal of excess polymer by the application of thermal energy is particularly suitable for applications which involve heat-resistant materials (substrates) such as, e.g., glass, ceramic, metal and heat-resistant polymers.

Especially in the field of electronics and, in particular in applications which involve temperature-sensitive substrates (e.g., polymers, cellulose-based, materials etc.) the presence of significant amounts of excess polymer is undesirable because on the one hand the excess polymer may have a substantial adverse effect on the conductivity of the electrically conductive features printed on the substrates and on the other hand the removal of the excess polymer by thermal means will usually not be possible without severely damaging or destroying the substrate. Accordingly, in these cases the silver nanoparticles should be substantially free of excess polymer. While even the nanoparticles which are free of excess polymer still have vinyl pyrrolidone polymer adsorbed on their surfaces it has unexpectedly been found that with the adsorbed polymer alone substantial electric conductivity can be achieved at sintering temperatures of the deposited ink which are as low as about 100° C. Without wishing to be bound by any theory, it is assumed that already at these low sintering temperatures the adsorbed vinyl pyrrolidone polymer becomes mobile enough to at least partially and sufficiently expose the silver cores of the individual nanoparticles to allow a direct contact between (and sintering of) these silver cores, whereby electrical conductivity is established. Details regarding the formulation and properties of printable inks comprising vinyl pyrrolidone polymers are disclosed in U.S. Provisional Application Ser. No. 60/643,577 entitled "Metal Nanoparticle Compositions," the entire disclosure whereof is incorporated by reference herein.

In a further aspect of the preferred process of the present invention, at least about 90%, e.g., at least about 95% of the silver nanoparticles may be of a substantially spherical shape, and/or at least about 90%, preferably at least about 95% of the nanoparticles may have a diameter of not more than about 80 nm and/or at least about 90% of the nanoparticles may have a diameter of from about 10 nm to about 70 nm and/or at least about 80 volume percent of the nanoparticles may be not larger than about 1.5 times the average particle size. Preferably, the silver nanoparticles will be substantially free of micron-size (and larger) particles. Even more preferably, they will be substantially free of particles having a size of more than about 200 nm, e.g., of more than about 150 nm.

EXAMPLES

The present invention will be further illustrated by the following non-limiting examples.

Example 1

In a mixing tank a solution of 1000 g of PVP (M.W. 10,000, Aldrich) in 2.5 L of ethylene glycol is prepared and heated to 120° C. In a second mixing tank, 125 g of silver nitrate is dissolved in 500 ml of ethylene glycol at 25° C.; These two solutions are rapidly combined (within about 5 seconds) in a reactor, in which the combined solutions (immediately after combination at a temperature of about 114° C.) are stirred at 120° C. for about 1 hour. The resultant reaction mixture is allowed to cool to room temperature and about 0.25 L of ethylene glycol is added thereto to replace evaporated ethylene glycol. This mixture is stirred at high speed for about 30 minutes to resuspend any particles that have settled during the reaction. The resultant mixture is transferred to a mixing tank where 12 L of acetone and about 1 L of ethylene glycol are added. The resultant mixture is stirred thoroughly and then transferred to a centrifuge where it is centrifuged for about 20 minutes at 1,500 g to separate the silver nanoparticles from the liquid phase. This affords 70 g of nanoparticles which have PVP adsorbed thereon. The particles are subsequently suspended in 2,000 ml of ethanol to remove, inter alia, excess PVP, i.e., PVP that is not adsorbed on the nanoparticles but is present merely as a contaminant. At this point, the ethanol suspension of particles is preferably filtered through a 1.5 µm nylon filter, thus filtering out particles that are larger than 1.5 µm. The filtrate is subsequently centrifuged and the resulting cake is dried in a vacuum oven at about 35° C. and about 10-2 torr to afford dry nanoparticles. These nanoparticles exhibit a PVP content of about 4 to about 8 weight percent, depending on the time the nanoparticles have been in contact with the ethanol.

Alternatively, the ethanol suspension may be centrifuged without first filtering through a 1.5 µm nylon filter. The resultant filter cake of nanoparticles is dried in a vacuum oven at about 35° C. and about $10^{-2}$ torr to afford dry nanoparticles. These nanoparticles, like the particles obtained after filtering through a 1.5 µm filter, exhibit a PVP content of about 4 to about 8 weight percent, depending on the time the nanoparticles have been in contact with the ethanol.

ICP (inductively coupled plasma) data indicates that the longer the particles are in contact with the ethanol, the more of the acetone and ethylene glycol present in the PVP matrix is displaced by ethanol, resulting in particles with an increasingly higher silver content.

It is believed that several characteristics of the reagents that are used in the process described above may ultimately affect the particle size distribution (PSD) of the nanoparticles produced by the process. At least four such characteristics are the water content of the PVP, the 2-pyrrolidone content of the PVP (PVP inherently contains 2-pyrrolidone), the formic acid content of the PVP and the water content of the ethylene glycol used.

Although the reasons are not entirely clear at this time, it has been observed that the water content of the PVP may have an effect on the PSD of the nanoparticles produced by the process described above. PVP is a hygroscopic substance that typically has a residual amount of water contained therein. In some cases, the presence of water in the PVP leads to the production of nanoparticles with a desirable PSD. In other cases, however, when the water content in the PVP is reduced, the same result is observed. Thus, it is not entirely clear if it is preferable to have PVP where the water content has been reduced or PVP where the residual water content is not reduced. In one embodiment, the water content of the PVP is about 1-10% by weight, or about 1-8% by weight, or about 2-10% by weight or preferably about 2-7% by weight. The water content of the PVP may be reduced by heating the PVP at about 70-80° C. overnight (e.g., 8-14 hours). The PVP may optionally be stirred while it is heated. In addition, the heating may be optionally performed under an inert atmosphere (e.g., argon and nitrogen) or in vacuo.

Although the reasons are not entirely clear at this time, it has also been observed that the presence of 2-pyrrolidone in the PVP may have an effect on the PSD of the nanoparticles produced by the process described above. 2-pyrrolidone is a contaminant comprised in the PVP that results from the synthesis of PVP. In one embodiment, the 2-pyrrolidone content of the PVP is about 1-10% by weight, or about 1-8% by weight, or about 1-5% by weight or preferably about 5% by weight.

In addition, although the reasons are not entirely clear at this time, it has also been observed that the presence of formic acid in the PVP may have an effect on the PSD of the nanoparticles produced by the process described above. Formic acid is a contaminant that may be comprised in the PVP that results from the synthesis of PVP. In some cases, the presence of formic acid in the PVP leads to the production of nanoparticles with a desirable PSD. In other cases, however, when the formic acid content in the PVP is reduced, the same result is observed. Thus, it is not clear if it is preferable to have PVP where the formic acid content has been reduced or PVP where the formic acid content is not reduced. In one embodiment, the formic acid content of the PVP is about 0-2% by weight, or about 0-1% by weight, or about 0-0.8% by weight or preferably about 0.3% by weight. The formic acid content of the PVP may be reduced by heating the PVP at about 70-80° C. overnight (e.g., 8-14 hours). The PVP may optionally be stirred while it is heated. In addition, the heating may be optionally performed under an inert atmosphere (e.g. argon and nitrogen) or in vacuo.

Finally, although the reasons are not entirely clear at this time, it has also been observed that the presence of water in the ethylene glycol may have an effect on the PSD of the nanoparticles produced by the process described above. It is possible that some water must be present in the ethylene glycol in order to produce nanoparticles with a desirable PSD. Without being bound by any particular theory, it is possible that the presence of water content in ethylene glycol influences the equilibrium between ethylene glycol and its decomposition product, acetaldehyde, according to the reaction shown below:

Even though it is possible that it is produced in an extremely small quantity (i.e., the equilibrium favors ethylene glycol), the acetaldehyde produced, in turn, acts as a reducing agent for the silver nitrate, thereby effecting the reduction of silver ions in silver nitrate to silver metal. The silver metal, in turn, can precipitate out of the ethylene glycol solution prior to mixing the silver nitrate/ethylene glycol solution with the PVP/ethylene glycol solution. It is possible that the precipitation of silver metal in the silver nitrate/ethylene glycol solution, prior to mixing with the PVP/ethylene glycol solution, could lead to the production of nanoparticles once the solutions are mixed, where the nanoparticles have an undesirable PSD (e.g., a polydisperse powder fraction with an increased amount of large particles and agglomerates). In one embodiment, the water content of the ethylene glycol is about 0.01-0.10% by weight, or about 0.01-0.05% by weight, or about 0.01-0.04% by weight or preferably about 0.04% by weight.

Example 2

Effect of PVP Molecular Weight on Resistivity and Curing Temperature

Silver nanoparticles can be synthesized using 58,000 g/mol PVP using a process substantially the same as the process used to synthesize silver nanoparticles using 10,000 g/mol PVP by mixing a PVP/ethylene glycol solution with a silver nitrate/ethylene glycol solution. Once the reaction is complete, 250 mL of ethylene glycol is mixed into the reaction solution after cooling down. The resulting solution is equally divided into five 4-L Nalgene® bottles. 200 mL of ethylene glycol and 3 L of acetone are added to each plastic bottle. The bottles are sealed with lids and shaken up to create a black precipitate suspension in the solvent mixture. The suspensions are transferred to centrifuge bottles and centrifuged at 2,200 RPM for 10 minutes. The clear, light orange supernatants are discarded to leave behind a reflective, silver cake. More black suspension is added to the same bottles and the separation steps are repeated until all of the silver nanoparticles are caked in the bottom of the centrifuge bottles. 600 mL of ethanol are added to each centrifuge bottle to remove, inter alia, excess PVP. At this point, the ethanol suspension of particles is preferably filtered through a 1.5 μm nylon filter, thus filtering out particles that are larger than 1.5 μm. The filtrate is subsequently centrifuged and the resulting cake is dried in vacuo for 2-3 hours.

Alternatively, the ethanol suspension may be centrifuged without filtering through a 1.5 μm nylon filter. In this case, the bottles are centrifuged at 2,200 RPM overnight, and the clear, dark orange supernatants are discarded to leave behind a highly reflective, bluish-silver cake. The silver nanoparticles are then dried in vacuo for 2-3 hours to form gold-colored granules.

Silver nanoparticle inks are spin coated onto glass and tested to ascertain the electrical properties. Liquid crystal display (LCD) glass slides are cut into 2" squares and given 5 minutes of UV-Ozone treatment. This is followed by wiping the slides with a lint-free cloth wetted with acetone and then another lint-free cloth wetted by denatured ethanol. In succession, each slide is secured to a 2" vacuum chuck on the spin coater. The slide is spun at 500 RPM for 10 seconds while 0.8 mL of silver ink is dispensed using a micropipette, after which the slide is spun at 1,000 RPM for 20 seconds. After spin coating, slides are placed in a pre-heated Despatch oven set to either 100 or 120° C. for 60 minutes to cure the silver ink films. Then the silver-coated slides are removed and allowed to cool. Each slide is placed on the four-point probe station, and five resistance measurements are taken near the center of the silver films. After the measurements are taken, a 1-2 mm wide, 0.5-1 cm long scratch is made in the center of each film using a stainless steel scalpel. When making the scratch, enough pressure is applied to remove the ink layer but not enough to significantly scratch the glass substrate. Then the layer thickness is measured across five locations along the scratch, using the scratch as a reference, on the Zygo profilometer. Finally, the resistance and thickness measurements are used to calculate the resistivity for each silver film.

The electrical testing of six silver inks formulated from different silver nanoparticles made with the 10,000 g/mol PVP it was observed that the average resistivity of the samples cured at 100° C. is 101X bulk silver over a range of 22.1-234X bulk silver. For curing at 120° C., the average resistivity of the samples is 17.8X bulk silver over a range of 14.3-24.2X bulk silver. Unexpectedly, for the ink sample made with silver nanoparticles formed in the presence of 58,000 g/mol PVP, the average resistivity is 12.8X bulk, silver when cured at 100° C. and 7.20X bulk silver when cured at 120° C. It is evident from the data given above that, relative to inks that employ 10,000 g/mol PVP, the ink that employs 58,000 g/mol PVP results in superior electrical performance at a relatively low curing temperature. The ability of achieving such superior electrical performance at relatively low curing temperatures with inks comprising 58,000 g/mol PVP facilitates printing such inks on flexible substrates.

Example 3

To demonstrate the effect of the rate of addition and the temperature of the silver nitrate solution, a reaction of the type described in Example 1 was conducted with different addition rates and temperatures of the solutions. The results are summarized in Table 1 below.

solution in two portions 20 minutes apart affords a somewhat better but still unsatisfactory result. The one-shot addition of the silver nitrate solution to the PVP solution at room temperature (Experiment 6) results in a relatively broad particle size distribution, while it is satisfactory in terms of particle size and shape. The one-shot addition of a silver nitrate solution to a 120° C. PVP solution affords a good control of particle size and shape and a narrow size distribution, with slightly better results in the case of a silver nitrate solution at room temperature compared to a solution at 120° C.

Example 4

To 4 L of a particle suspension composed of 1.0 kg of unbound PVP, 3 L of ethylene glycol and about 71 g of silver nanoparticles having PVP adsorbed thereon (prepared according to a process similar to that described in Example 1) is added 12 L of acetone. The resultant mixture is subjected to centrifugation at 1,500 g. An oil suspension is formed during centrifugation. The particle oil suspension is difficult to break and complete separation of the particles from the liquid phase cannot be accomplished.

Example 5

Example 3 is repeated, except that 1.25 L of ethylene glycol is added before carrying out the centrifugation. The extra ethylene glycol prevents the formation of an oil. The particles form a cake and complete separation of the particles from the liquid phase can be accomplished.

Example 6

To 1 L of a particle suspension composed of 250 g of unbound PVP, 750 mL of ethylene glycol and about 20 g of silver nanoparticles having PVP adsorbed thereon (prepared according to a process similar to that described in Example 1) is added 1 L of deionized water and the resultant mixture is subjected to a diafiltration in a tangential cross-flow manner. (membrane made of polysulfone, pore size 50 nm, surface area 615 cm$^2$, Spectrum Laboratories, Inc.; applied pressure

TABLE 1

| Experiment No. | Temperature of AgNO$_3$/ ethylene glycol solution [° C.] | Temperature of PVP/ ethylene glycol solution [° C.] | Addition | Comments |
|---|---|---|---|---|
| 1 | RT | 120 | Half&half/20 min | Larger particles, good size distribution, long needles (up to 100 μm) |
| 2 | RT | 120 | Drop-wise/20 min | No size and shape control |
| 3 | 120 | 120 | Half&half/20 min | Some large chunks, broad size distribution |
| 4 | 120 | 120 | Drop-wise/20 min | No control, large chunks |
| 5 | 120 | 120 | One-shot | Good control of size and shape, narrow size distribution |
| 6 | RT | RT | One-shot | Good control of size and shape, relatively broad distribution |
| 7 | RT | 120 | One-shot | Good control of size and shape, narrow size distribution; slightly better than Exp. 5 |

RT = room temperature

From the results summarized in Table 1 it can be seen that the drop-wise addition of the silver nitrate solution to the PVP solution (which is similar to dissolving solid silver nitrate in the PVP solution) does not allow any control of the size and shape of the silver nanoparticles. Adding the silver nitrate about 10 psi gauge to about 20 psi gauge). The diafiltration is carried out in concentration mode and is performed until the retentate has a volume of about 100 mL. To the retentate is added 1 L of deionized water and diafiltration is again performed in concentration mode until the volume of the retentate is about 100 mL. To the resultant second retentate is added 250 mL of a mixture of 40% by weight of ethylene glycol, 25% by weight of glycerol and 35% by weight of ethanol and diafiltration is performed in concentration mode until the volume of the retentate is about 100 mL. To the resultant third retentate is added 103 mL of a mixture of 40% by weight of ethylene glycol, 25% by weight of glycerol and 35% by weight of ethanol and diafiltration is performed in concentration mode until the volume of the retentate is about 100 mL. The resultant fourth retentate is passed through syringe filters (diameter 30 mm, pore size 1.5 µm) to prepare an ink for ink-jet printing. This ink has properties similar to those of an ink formulated from dry silver nanoparticles which have been synthesized in the same manner as the particles of the initial suspension.

Example 7

To 1 L of a particle suspension composed of 250 g of unbound PVP, 750 mL of ethylene glycol and about 20 g of silver nanoparticles having PVP adsorbed thereon (prepared according to a process similar to that described in Example 1) is added 2 L of deionized water and the resultant mixture is subjected to a diafiltration in a tangential cross-flow manner. The diafiltration is carried out in concentration mode and is performed until the retentate has a volume of about 100 mL. To the retentate is added 1 L of deionized water and diafiltration is performed in concentration mode until the volume of the retentate is about 100 mL. To the resultant second retentate is added 500 mL of ethanol and diafiltration is performed in concentration mode until the volume of the retentate is about 100 mL. The resultant third retentate is filled in a container with a loose fitting top and placed in a vacuum oven that is maintained at 35° C. A vacuum is applied on the oven and continuously drawn, maintaining the pressure at about 845 mbar until the particles are dry. The dried particles are analyzed by TGA (thermogravimetric analysis) and ICP. TGA indicates that the particles contain about 90% by weight of silver. ICP indicates the following composition (in % by weight): Ag 86.54, N 0.85, C 5.48, H 0.85. The dried particles are formulated into an ink for ink-jet printing.

Example 8

To 1 L of a particle suspension composed of 250 g of unbound PVP, 750 mL of ethylene glycol and about 20 g of silver nanoparticles having PVP adsorbed thereon (prepared according to a process similar to that described in Example 1) is added 2 L of deionized water and the resultant mixture is subjected to a diafiltration in a tangential cross-flow manner. The diafiltration is carried out in concentration mode and is performed until the retentate has a volume of about 100 mL. To the retentate is added 2 L of deionized water and diafiltration is performed in concentration mode until the volume of the retentate is about 100 mL. To the resultant second retentate is added 2 L of deionized water and diafiltration is performed in concentration mode until the volume of the retentate is about 100 mL. To the resultant third retentate is added 1 L of ethanol and diafiltration is performed in concentration mode until the volume of the retentate is about 100 mL. The resultant fourth retentate is filled in a container with a loose fitting top and placed in a vacuum oven that is maintained at 35° C. A vacuum is applied on the oven and continuously drawn, maintaining the pressure at 25 inch Hg until the particles are dry. The dried particles are analyzed by TGA (thermogravimetric analysis) and ICP. TGA indicates that the particles contain about 95% by weight of silver. ICP indicates the following composition (in % by weight): Ag 92.79, N 0.49, C 2.57, H 0.27. The dried particles are formulated into an ink for ink-jet printing.

Example 9

Silver nanoparticles prepared according to the process described in Example 1 (ranging from about 30 nm to about 50 nm in size) are suspended in a solvent mixture composed of, in weight percent based on the total weight of the solvent mixture, 40% of ethylene glycol, 35% of ethanol and 25% of glycerol to produce an ink for ink-jet printing. The concentration of the silver particles in the ink is 20% by weight.

The ink had the following properties:

| | |
|---|---|
| Viscosity* (22° C.) | 14.4 cP |
| Surface tension** (25° C.) | 31 dynes/cm |
| Density | 1.24 g/cc |

*measured at 100 rpm with a Brookfield DVII+ viscometer (spindle no. 18)
**measured with a KSV Sigma 703 digital tensiometer with a standard Du Nouy ring method The ink is chemically stable for 6 months, some sedimentation occurring after 7 days at room temperature.

A Spectra SE 128 head (a commercial piezo ink-jet head) is loaded with the above ink and the following optimized printing parameters are established:

Optimized Jetting Parameters (at 22-23° C.):

| | |
|---|---|
| Pulse Voltage | 120 Volts |
| Pulse Frequency | 500 Hz |
| | (for up to one 1 hour |
| | of continuous operation) |
| Pulse Rise Time | 2.5 µs |
| Pulse Width | 12.0 µs |
| Pulse Fall Time | 2.5 µs |
| Meniscus Vacuum | 3.0 inches of water |
| Performance Summary: | |
| Drop Size | 39 µm |
| | (calculated volume 31 pL) |
| Drop Velocity | 0.33 m/s |
| Spot Size (average) | 70 µm |
| | (on Kapton ®; measured |
| | using optical microscope) |

The deposited ink can be rendered conductive after curing in air at temperatures as low as 100° C. The ink exhibits a high metal yield, allowing single pass printing.

Using the above optimized jetting parameters, the above ink is deposited in a single pass with a Spectra SE 128 head on a Kapton® substrate and on a glass substrate to print a line. The line has a maximum width of about 140 µm (Kapton®) and about 160 µm (glass) and a parabolic cross-section. The thickness of the line at the edges averages about 275 nm (Kapton®) and about 240 nm (glass) and the maximum height of the line is about 390 nm (Kapton® and glass). The differences between Kapton® and glass reflect the different wetting behavior of the ink on these two types of substrate materials.

Single pass printing with the above ink affords a sheet resistivity of from about 0.1 to about 0.5 Ω/sq. The printed material shows a bulk resistivity in the fully sintered state of from about 4 to about 5 µΩ·cm (about 2.5-3 times the bulk resistivity of silver).

The polymer (polyvinylpyrrolidone (PVP)) on the surface of the silver nanoparticles allows the sintering of a deposited ink at very low temperatures, e.g., in the range of from about 100° C. to about 150° C. The PVP does not volatilize or significantly decompose at these low temperatures. Without wishing to be bound by any theory, it is believed that at these low temperatures the polymer moves out of the way, allowing the cores of the nanoparticles to come into direct contact and sinter together (necking). In comparison to its anti-agglomeration effect in the printing ink prior to printing, the polymer in the deposited and heat-treated ink assumes a new function, i.e., it promotes the adhesion of the printed material to a range of polymeric substrates such as, e.g., FR4 (fiberglass-epoxy resin) and Mylar® (polyethylene terephthalate) and provides structural strength. As a result of the low-temperature sintering mechanism a continuous percolation network is formed that provides continuous channels for the conduction of electrons to flow throughout the material without obstacles. This is fundamentally different from the traditional polymer thick film approach, where electrical conductivity is established during thermal curing as a result of polymer matrix shrinkage, inducing compressive stress on the flake particles and causing a reduction in their large contact resistance.

When higher-temperature sintering is performed (at about 300° C. to about 550° C.), the polymer volatilizes. As a result, sintering will occur and in comparison to low-temperature sintering a much denser metal material is formed. This leads to a better conductivity (close to the conductivity of the bulk metal), better adhesion to substrates such as glass, and better structural integrity and/or scratch resistance.

In the low temperature sintering range (from about 100° C. to about 150° C.), the present ink can advantageously be employed for applications such as, e.g., printed RF ID antennas and tags, digitally printed circuit boards, smart packages, "disposable electronics" printed on plastics or paper stock, etc. In the medium temperature range (from about 150° C. to about 300° C.) the ink may, for example, be used for printing interconnects for applications in printed logic and printed active matrix backpanes for applications such as polymer electronics, OLED displays, AMLCD technology, etc. In the high temperature range (from about 300° C. to about 550° C.) its good performance and adhesion to glass make it useful for printed display applications such as, e.g., plasma display panels.

Example 10

Coductivity Testing of Compositions on Various Paper Substrates

It was found that the Ag ink composition of Example 9 yields ink-jet printed lines on Epson Gloss IJ ink-jet paper that exhibit an electric resistance after annealing at 100° C. which is comparable to that of the same ink printed on Kapton and annealed at 200° C.

In one set of tests, the following experiments were carried out:

An aqueous silver ink was jetted onto glossy IJ photo paper (Canon), producing three groups of 4 lines; 1 set as single pass, 1 set as double pass, and 1 set as triple pass. All three sets were annealed on a hot plate set to 200° C. for 30 minutes. After the anneal, the lines were tested for electrical conductivity; all lines failed to exhibit conductivity.

The solvent-based Ag ink of Example 9 was printed on EPSON S041286 Gloss photo paper to produce samples for comparison testing with a commercially available Ag ink sample (Nippon Paint) printed on Cannon gloss paper (model not known). Two samples were printed, 1 coupon with a single print pass and 1 coupon with a double print pass.

The double pass print was annealed at 100° C. for 60 minutes.

The commercial Ag ink sample was cured at 100° C. for 60 minutes.

The single pass print was annealed at 100° C. for 110 minutes.

Both samples produced with the ink of Example 9 exhibited very good conductivity, comparable to the same silver ink, printed on Kapton, and annealed at 200° C. for 30 minutes.

The commercially available ink yielded a conductivity much worse than that of the ink samples according to the present invention.

The ink of Example 9 was printed on four different substrates: (a) Kapton HN-300, (b) Hammermill 05502-0 gloss color copy paper, (c) Canon Bubblejet Gloss Photo Paper GP-301 and (d) Epson Gloss Photo Paper for ink-jet S041286.

The results listed in the table below confirm the superior performance of the Example 9 ink/Epson paper combination.

| Ink | Substrate | Cure Temp/ Time | Approx. Resistivity ($\mu\Omega$ *cm)[1] | pH of Substrate[3] |
|---|---|---|---|---|
| Example 9 | Kapton | 200° C./ 30 min | 21 | N/A |
| Example 9 | Kapton | 100° C./ 60 min | 180 | N/A |
| Example 9 | Epson Photo Paper | 100° C./ 60 min | 16 | 4-5 |
| Example 9 | Xerox High Gloss | 100° C./ 60 min | No Conductivity | N/A |
| Example 9 | Canon Photo Paper | 100° C./ 60 min | 525 | 6.5-7 |
| Commercial | Canon Photo Paper | 100° C./ 60 min | 5400[2] | 6.5-7 |
| N/A | HP Premium Satin Gloss | N/A | N/A | 5.0 |
| N/A | HP Premium Gloss | N/A | N/A | 5.0 |
| N/A | Kodak Premium Gloss | N/A | N/A | 5.5 |
| N/A | Kodak Ultima | N/A | N/A | 5.0-5.5 |
| N/A | Canon PP101 | N/A | N/A | 6.5 |
| N/A | Canon PR101 | N/A | N/A | 6.5-7.0 |
| N/A | Fuji | N/A | N/A | 7.0 |

[1] assuming 1-micron line thickness
[2] average based on fewer measurements than ink of Example 9
[3] pH of the substrate determined using solution indicator kit: VWR VW 5704-1 Universal Indicator solution (isopropanol 50% (v/v), NaOH, $H_2O$).

The results shown in the table above suggest that it is possible that the pH of the substrate may have an effect on the resistivity of the inks printed thereon. It is contemplated that an ink that is printed on an acidic substrate will have a lower resistivity than an ink printed on a relatively more basic substrate (compare Example 9 ink printed on Epson photo paper versus the same ink printed on Canon photo paper).

It is known that Canon photo paper is coated with basic alumina, while Epson photo paper is coated with silica. See, e.g., Blum, A. E. and Eberl, E. E., *Clays and Clay Minerals* 52: 589-602 (2004), the contents of which are incorporated herein by reference in their entirety. Other coatings, e.g., alumina doped silica, are also known in the art. See, e.g., European Patent Application EP0995718, the contents of which are incorporated herein by reference in their entirety. It is possible that the silica coating on the Epson paper imparts acidic properties in the paper. Likewise, it is possible that the alumina coating on the Canon paper imparts less acidic properties in that paper.

The reasons for the apparent effect of substrate pH on the resistivity of the ink printed thereon are not entirely clear at this time. It is possible that, in addition to the substrate pH, other substrate characteristics, alone, or in conjunction with the presence of certain materials found in the ink formulation, may be the actual factors that cause inks printed on certain substrates to have lower resistivities than when they are printed on other substrates. Such characteristics may include the nature of coatings on the substrate and substrate porosity.

As mentioned above, Epson paper is coated with silica, while the Canon paper is coated with basic alumina. Without being bound by any particular theory, it is possible that the PVP on the nanoparticles adsorbs to some extent on the silica coating on the Epson paper, thereby exposing the silver nanoparticle surface. Adsorption of the PVP on silica may be expected, since it is known that silica has a high affinity for PVP. See, e.g., Blum, A. E. and Eberl, E. E., *Clays and Clay Minerals* 52: 589-602 (2004), the contents of which are incorporated herein by reference in their entirety. When the ink is subsequently cured, the exposed silver nanoparticles may be in closer contact with one another and may sinter to form a network with decreased resistivity.

It is also possible that the substrate porosity may lead to inks with decreased resistivity upon curing. Without being bound by any particular theory, it is possible that the substrate porosity, in conjunction with the presence of plasticizers (e.g., glycerol) in the ink formulation may be aiding in the adsorption of PVP into the pores of the substrate, thereby exposing the silver of the nanoparticles. Without being bound by any particular theory, it is possible that plasticizers sufficiently soften PVP such that the PVP can migrate onto the substrate and away from the silver nanoparticles. When the ink is subsequently cured, the exposed silver nanoparticles may be in closer contact with one another and may sinter to form a network with decreased resistivity.

It is noted that the foregoing examples have been provided merely for the purpose of explanation and are in no way to be construed as limiting of the present invention. While the present invention has been described with reference to an exemplary embodiment, it is understood that the words that have been used are words of description and illustration, rather than words of limitation. Changes may be made, within the purview of the appended claims, as presently stated and as amended, without departing from the scope and spirit of the present invention in its aspects. Although the invention has been described herein with reference to particular means, materials and embodiments, the invention is not intended to be limited to the particulars disclosed herein. Instead, the invention extends to all functionally equivalent structures, methods and uses, such as are within the scope of the appended claims.

What is claimed is:

1. A process for the production of metal nanoparticles, wherein the process comprises a rapid mixing of a solution of at least about 0.1 mole of a metal compound that is capable of being reduced to a metal by a polyol with a heated solution that comprises a polyol and a substance that is capable of being adsorbed on the nanoparticles, wherein the rapid mixing comprises combining the solutions within not more than about 1 minute.

2. The process of claim 1, further comprising (a) isolating the metal nanoparticles; (b) suspending the metal nanoparticles in a liquid that is capable of dissolving the substance that is adsorbed on the nanoparticles; and (c) filtering the suspending metal nanoparticles.

3. The process of claim 2, wherein the liquid comprises ethanol.

4. The process of claim 1, wherein the metal comprises a transition metal.

5. The process of claim 4, wherein the transition metal comprises at least one of gold, silver, copper, nickel, cobalt, palladium, platinum, iridium, osmium, rhodium, ruthenium, rhenium, vanadium, chromium, manganese, niobium, molybdenum, tungsten, tantalum, iron and cadmium.

6. The process of claim 4, wherein the metal comprises at least one of gold, silver, copper and nickel.

7. The process of claim 1, wherein the metal comprises silver.

8. The process of claim 1, wherein the metal compound comprises a salt of an inorganic acid.

9. The process of claim 8, wherein the metal compound comprises a nitrate.

10. The process of claim 1, wherein the metal compound comprises a salt of an organic acid.

11. The process of claim 10, wherein the metal compound comprises an acetate or trifluoroacetate.

12. The process of claim 1, wherein the metal compound comprises at least one of silver nitrate, silver acetate, silver trifluoroacetate, silver oxide, copper oxide, copper hydroxide, copper sulfate, nickel oxide, nickel hydroxide, nickel chloride, nickel sulfate, nickel acetate, cobalt oxide, cobalt hydroxide, cobalt chloride and cobalt sulfate.

13. The process of claim 1, wherein the polyol comprises a polyol having from 2 to 6 hydroxy groups.

14. The process of claim 1, wherein the polyol comprises at least one glycol.

15. The process of claim 14, wherein the at least one glycol comprises from 2 to 4 carbon atoms.

16. The process of claim 14, wherein the polyol comprises at least one of ethylene glycol and propylene glycol.

17. The process of claim 1, wherein the polyol comprises ethylene glycol.

18. The process of claim 1, wherein the polyol comprises one or more of ethylene glycol, diethylene glycol, triethylene glycol, tetraethylene glycol, propylene glycol, dipropylene glycol, 1,3-propanediol, 1,2-butanediol, 1,3-butanediol, 1,4-butanediol, 2,3-butanediol, glycerol, trimethylolpropane, triethanolamine and trihydroxymethylaminomethane.

19. The process of claim 1, wherein the substance that is capable of being adsorbed on the nanoparticles comprises a substance that is capable of substantially preventing an agglomeration of the nanoparticles.

20. The process of claim 19, wherein the substance that is capable of being adsorbed on the nanoparticles is present in a sufficient amount to substantially prevent an agglomeration of the nanoparticles.

21. The process of claim 1, wherein the substance that is capable of being adsorbed on the nanoparticles comprises at least two heteroatoms selected from O and N.

22. The process of claim 1, wherein the substance that is capable of being adsorbed on the nanoparticles comprises one or more of a hydroxy group, a carbonyl group, an ether group and an amino group.

23. The process of claim 1, wherein the substance that is capable of being adsorbed on the nanoparticles comprises a substance that is capable of reducing the metal compound.

24. The process of claim 1, wherein the substance that is capable of being adsorbed on the nanoparticles comprises a polymer.

25. The process of claim 24, wherein the polymer comprises units of a monomer which comprises at least one heteroatom selected from O and N.

26. The process of claim 24, wherein the polymer comprises units of a monomer which comprises at least two heteroatoms selected from O and N.

27. The process of claim 24, wherein the polymer comprises units of a monomer which comprises one or more of a hydroxyl group, a carbonyl group, an ether group and an amino group.

28. The process of claim 24, wherein the polymer comprises at least one structural element selected from —COO—, —O—CO—O—, —CO—O—CO—, —C—O—C—, —CONR—, —NR—CO—O—, —NR$^1$—CO—NR$^2$—, —CO—NR—CO—, —SO$_2$—NR— and —SO$_2$—O—, wherein R, R$^1$ and R$^2$ each independently represent hydrogen or an organic radical.

29. The process of claim 24, wherein the polymer comprises a polymer of vinyl pyrrolidone.

30. The process of claim 29, wherein the polymer of vinyl pyrrolidone comprises a vinyl pyrrolidone homopolymer.

31. The process of claim 24, wherein the polymer has a weight average molecular weight of up to about 100,000.

32. The process of claim 24, wherein the polymer has a weight average molecular weight of not less than about 1,000.

33. The process of claim 24, wherein the polymer has a weight average molecular weight of not less than about 58,000.

34. The process of claim 24, wherein the polymer comprises water in an amount of about 1-10% by weight.

35. The process of claim 24, wherein the polymer comprises 2-pyrrolidone in an amount of about 1-10% by weight.

36. The process of claim 24, wherein the polymer comprises formic acid in an amount of about 0-2% by weight.

37. The process of claim 24, wherein the polyol comprises water in an amount of about 0.01-0.10% by weight.

38. The process of claim 1, wherein the solution of the metal compound comprises a polyol.

39. The process of claim 38, wherein the polyol comprises water in an amount of about 0.01-0.10% by weight.

40. The process of claim 38, wherein a polyol of the solution of the metal compound and a polyol of the heated solution are the same.

41. The process of claim 1, wherein the heated solution has a temperature of at least about 80° C.

42. The process of claim 1, wherein the heated solution has a temperature of at least about 120° C.

43. The process of claim 1, wherein the heated solution has a temperature of not higher than about 180° C.

44. The process of claim 1, wherein the heated solution has a temperature of not higher than about 140° C.

45. The process of claim 1, wherein a temperature of the solution of the metal compound is not higher than about 40° C.

46. The process of claim 1, wherein a temperature of the solution of the metal compound is not higher than about 40° C. and the heated solution has a temperature of at least about 80° C.

47. The process of claim 1, wherein the rapid mixing comprises combining the solutions within a period of not more than about 30 seconds.

48. The process of claim 1, wherein the solutions are mixed by a one-shot addition of one of the solutions to another one of the solutions.

49. The process of claim 1, wherein the rapid mixing is accompanied by at least one of stirring, shaking and sonication.

50. The process of claim 1, wherein the solution of the metal compound comprises at least about 0.5 mole of the metal compound.

51. The process of claim 1, wherein the solution of the metal compound comprises at least about 0.75 mole of the metal compound.

52. The process of claim 1, wherein a total volume of the solution of the metal compound and the heated solution per mole of the metal compound is not larger than about 6 liters.

53. The process of claim 52, wherein the total volume is not larger than about 4 liters.

54. The process of claim 1, wherein a volume ratio of the heated solution and the solution of the metal compound is not higher than about 10:1.

55. The process of claim 1, wherein a volume ratio of the heated solution and the solution of the metal compound is not lower than about 1:1.

56. The process of claim 1, wherein the substance that is capable of being adsorbed on the nanoparticles comprises a polymer comprising monomer units and a molar ratio of the monomer units and the metal compound is at least about 3:1.

57. The process of claim 56, wherein the molar ratio is at least about 6:1.

58. The process of claim 56, wherein the molar ratio is not higher than about 100:1.

59. The process of claim 1, wherein the process further comprises a heating of the mixed solutions at a temperature of at least about 80° C. for a sufficient period to reduce at least a substantial portion of the metal compound to the metal.

60. The process of claim 59, wherein at least about 90% of the metal compound is reduced.

61. The process of claim 59, wherein the mixed solutions are heated at a temperature of at least about 100° C.

62. The process of claim 59, wherein the mixed solutions are heated at a temperature of at least about 120° C.

63. The process of claim 1, wherein the process further comprises a precipitation of formed nanoparticles.

64. The process of claim 63, wherein the precipitation comprises an addition of a sufficient amount of a nanoparticle-precipitating substance to precipitate at least a substantial portion of the nanoparticles.

65. The process of claim 64, wherein the nanoparticle-precipitating substance comprises an aprotic solvent.

66. The process of claim 65, wherein the aprotic solvent comprises a polar aprotic solvent.

67. The process of claim 65, wherein the aprotic solvent comprises a ketone.

68. The process of claim 67, wherein the ketone comprises acetone.

69. The process of claim 64, wherein at least one of before, during and after the addition of the nanoparticle-precipitating substance a protic solvent is added.

70. The process of claim 69, wherein the protic solvent comprises at least one of an alcohol and a polyol.

71. The process of claim 1, wherein the process further comprises an isolation of formed nanoparticles.

72. The process of claim 71, wherein the isolation comprises at least one of an ultrafiltration and a diafiltration.

73. The process of claim 1, wherein the process further comprises a washing of formed nanoparticles with a liquid that is capable of dissolving the substance that is capable of being adsorbed on the nanoparticles.

74. The process of claim 73, wherein the liquid comprises a protic organic solvent.

75. The process of claim 73, wherein the liquid comprises at least one of an alcohol, a polyol and water.

76. The process of claim 73, wherein the liquid comprises ethanol.

77. The process of claim 1, wherein the process is carried out continuously.

78. A process for the production of metal nanoparticles, wherein the process comprises a rapid mixing of a solution of at least about 0.25 mole of a compound of at least one metal selected from gold, silver, palladium, platinum, rhodium, copper, nickel and cobalt with a heated solution that comprises a polyol and a polymer that is capable of substantially preventing an agglomeration of the nanoparticles, wherein the rapid mixing comprises combining the solutions within not more than about 1 minute.

79. The process of claim 78, wherein the metal is selected from at least one of silver, copper and nickel.

80. The process of claim 78, wherein the metal comprises silver.

81. The process of claim 79, wherein the metal compound comprises silver nitrate.

82. The process of claim 78, wherein the polyol comprises at least one of ethylene glycol and propylene glycol.

83. The process of claim 78, wherein the polymer comprises units of a monomer which comprises at least one heteroatom selected from O and N.

84. The process of claim 78, wherein the polymer comprises at least one structural element selected from —COO—, —O—CO—O—, —CO—O—CO—, —C—O—C— —CONR—, —NR—CO—O—, —NR$^1$—CO—NR$^2$—, —CO—NR—CO—, —SO$_2$—NR— and —SO$_2$—O—, wherein R, R$^1$ and R$^2$ each independently represent hydrogen or an organic radical.

85. The process of claim 78, wherein the polymer comprises polyvinylpyrrolidone.

86. The process of claim 85, wherein the polyvinylpyrrolidone has a weight average molecular weight of from about 3,000 to about 60,000.

87. The process of claim 78, wherein the heated solution has a temperature of at least about 90° C.

88. The process of claim 87, wherein a temperature of the solution of the metal compound is not higher than about 30° C.

89. The process of claim 78, wherein the heated solution has a temperature of at least about 110° C.

90. The process of claim 78, wherein the heated solution has a temperature of not higher than about 160° C.

91. The process of claim 78, wherein the rapid mixing comprises combining the solutions within not more than about 15 seconds.

92. The process of claim 78, wherein the solution of the metal compound comprises at least about 0.5 mole of the metal compound.

93. The process of claim 92, wherein a total volume of the solution of the metal compound and the heated solution is not higher than about 5 liters per one mole of the metal compound.

94. The process of claim 93, wherein a volume ratio of the heated solution and the solution of the metal compound is from about 10:1 to about 3:1.

95. The process of claim 78, wherein the polymer comprises monomer units and a molar ratio of said monomer units and the metal compound is from about 3:1 to about 50:1.

96. The process of claim 78, wherein the nanoparticles are of a substantially uniform shape and size.

97. The process of claim 78, wherein at least about 90% of the nanoparticles are of a substantially spherical shape.

98. The process of claim 97, wherein at least about 90% of the nanoparticles have a diameter of not more than about 80 nm.

99. The process of claim 78, wherein the process further comprises keeping the mixed solutions at an elevated temperature to convert a substantial portion of the metal compound to nanoparticles.

100. The process of claim 99, wherein the mixed solutions are heated at a temperature of at least about 100° C.

101. The process of claim 78, wherein the process further comprises a precipitation of formed nanoparticles.

102. The process of claim 101, wherein the precipitation comprises an addition of a nanoparticle-precipitating liquid in a sufficient amount to precipitate at least a substantial portion of the nanoparticles.

103. The process of claim 102, wherein the nanoparticle-precipitating liquid comprises a polar aprotic solvent.

104. The process of claim 102, wherein the nanoparticle-precipitating liquid comprises a ketone.

105. The process of claim 78, wherein the process further comprises a separation of formed nanoparticles from a liquid phase.

106. The process of claim 105, wherein the separation comprises at least one of a diafiltration and an ultrafiltration.

107. The process of claim 78, wherein the process further comprises a washing of isolated nanoparticles with a liquid that is capable of dissolving the polymer.

108. The process of claim 107, wherein the liquid comprises ethanol.

109. The process of claim 107, wherein the washing comprises at least one of a diafiltration and an ultrafiltration.

110. The process of claim 78, wherein the process affords a nanoparticle containing reaction mixture and the process further comprises subjecting the reaction mixture to at least one of a diafiltration and an ultrafiltration.

111. A process for the production of silver nanoparticles, wherein the process comprises a rapid mixing of a solution of at least about 0.5 mole of a silver compound with a heated solution which comprises a polyol and a vinyl pyrrolidone polymer, wherein the rapid mixing comprises combining the solutions within not more than about 1 minute.

112. The process of claim 111, wherein the silver compound comprises at least one of silver nitrate, silver acetate, silver trifluoroacetate and silver oxide.

113. The process of claim 111, wherein the polyol comprises from 2 to 4 hydroxy groups.

114. The process of claim 111, wherein the polyol comprises at least one glycol.

115. The process of claim 114, wherein the vinyl pyrrolidone polymer comprises a vinyl pyrrolidone homopolymer.

116. The process of claim 115, wherein the vinyl pyrrolidone homopolymer has a weight average molecular weight of up to about 60,000.

117. The process of claim 115, wherein the vinyl pyrrolidone homopolymer has a weight average molecular weight of about 10,000.

118. The process of claim 111, wherein the solution of the silver compound comprises a polyol.

119. The process of claim 118, wherein the polyol comprises ethylene glycol.

120. The process of claim 111, wherein the heated solution has a temperature of from about 100° C. to about 140° C.

121. The process of claim 120, wherein a temperature of the solution of the silver compound is not higher than about 30° C.

122. The process of claim 121, wherein the solutions are combined by a one-shot addition of the solution of the silver compound to the heated solution.

123. The process of claim 122, wherein the solution of the silver compound comprises at least about 0.75 mole of the silver compound.

124. The process of claim 111, wherein the heated solution has a temperature of about 120° C.

125. The process of claim 111, wherein a combined volume of the solution of the silver compound and the heated solution is not larger than about 4 liters per mole of the silver compound.

126. The process of claim 125, wherein a volume ratio of the heated solution and the solution of the silver compound is from about 8:1 to about 4:1.

127. The process of claim 126, wherein the volume ratio is at least about 5:1.

128. The process of claim 111, wherein the vinyl pyrrolidone polymer is present in a sufficient amount to prevent a substantial agglomeration of the silver nanoparticles.

129. The process of claim 111, wherein a molar ratio of vinyl pyrrolidone units in the vinyl pyrrolidone polymer and the silver compound is from about 3:1 to about 50:1.

130. The process of claim 129, wherein the molar ratio is at least about 6:1.

131. The process of claim 129, wherein the molar ratio is about 12:1.

132. The process of claim 111, wherein the process further comprises keeping the mixed solutions at a temperature of at least about 100° C. for a sufficient period to convert at lease about 90% of the silver compound to elemental silver.

133. The process of claim 132, wherein the mixed solutions are heated at a temperature of about 120° C. until substantially all of silver compound is converted to elemental silver.

134. The process of claim 111, wherein the process further comprises a precipitation of formed nanoparticles.

135. The process of claim 134, wherein the precipitation comprises adding a sufficient amount of a nanoparticle-precipitating liquid that is miscible with a polyol to precipitate at least a substantial portion of the nanoparticles.

136. The process of claim 135, wherein the nanoparticle-precipitating liquid comprises a polar aprotic solvent.

137. The process of claim 136, wherein the solvent comprises acetone.

138. The process of claim 111, wherein the process further comprises a separation of nanoparticles from a liquid phase.

139. The process of claim 138, wherein the separation comprises at least one of an ultrafiltration and a diafiltration.

140. The process of claim 111, wherein the process further comprises a washing of isolated nanoparticles with a liquid that is capable of dissolving the vinyl pyrrolidone polymer.

141. The process of claim 140, wherein the liquid comprises ethanol.

142. A process for the production of silver nanoparticles, wherein the process comprises a one-shot addition of a solution of at least about 0.75 mole of a silver compound in at least one of ethylene glycol and propylene glycol to a heated solution of polyvinylpyrrolidone in at least one of ethylene glycol and propylene glycol, wherein the solution of the silver compound is at a temperature of not higher than about 30° C., the polyvinylpyrrolidone solution is at a temperature of at least about 110° C., a total volume of the solution of the silver compound and the polyvinylpyrrolidone solution is from about 3 to about 4 liters per one mole of the silver compound, a volume ratio of the polyvinylpyrrolidone solution and the solution of the silver compound is from about 4:1 to about 6:1 and a molar ratio of vinyl pyrrolidone units in the polyvinylpyrrolidone and the silver compound is from about 5:1 to about 15:1.

143. The process of claim 142, wherein the silver compound comprises silver nitrate.

144. The process of claim 142, wherein the process further comprises a heating of the combined solutions at a temperature of at least about 120° C. until substantially all of silver nitrate has reacted.

145. The process of claim 142, wherein the process further comprises a precipitation of the nanoparticles, which precipitation comprises an addition of acetone.

146. The process of claim 144, wherein the process further comprises a separation of precipitated nanoparticles from a liquid phase by at least one of a centrifugation, an ultrafiltration and a diafiltration.

147. The process of claim 142, wherein the process further comprises a washing of isolated nanoparticles with ethanol.

148. The process of claim 142, wherein the process further comprises a work-up of an obtained nanoparticle containing reaction mixture for isolating the nanoparticles, the work-up comprising at least one of a diafiltration and an ultrafiltration.

\* \* \* \* \*